US010317512B2

(12) United States Patent
Trotta et al.

(10) Patent No.: US 10,317,512 B2
(45) Date of Patent: Jun. 11, 2019

(54) RF SYSTEM WITH AN RFIC AND ANTENNA SYSTEM

(71) Applicant: Infineon Technologies AG, Neubiberg (DE)

(72) Inventors: Saverio Trotta, Munich (DE); Ashutosh Baheti, Munich (DE); Ismail Nasr, Unterhaching (DE); Ngoc-Hoa Huynh, Forstinning (DE); Martin Richard Niessner, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 461 days.

(21) Appl. No.: 14/954,395

(22) Filed: Nov. 30, 2015

(65) Prior Publication Data

US 2016/0178730 A1 Jun. 23, 2016

Related U.S. Application Data

(60) Provisional application No. 62/096,421, filed on Dec. 23, 2014, provisional application No. 62/201,895, (Continued)

(51) Int. Cl.
*G01S 7/03* (2006.01)
*G01S 7/00* (2006.01)
(Continued)

(52) U.S. Cl.
CPC .............. *G01S 7/032* (2013.01); *G01S 7/006* (2013.01); *G01S 7/354* (2013.01); *G01S 13/003* (2013.01);
(Continued)

(58) Field of Classification Search
CPC . G01S 7/006; G01S 7/03; G01S 7/032; G01S 13/931; H01L 2223/6677; H01L 2223/6683; H01Q 17/00–17/005
See application file for complete search history.

(56) References Cited

U.S. PATENT DOCUMENTS 4,241,347 A 12/1980 Albanese et al.
6,414,631 B1 7/2002 Fujimoto
(Continued)

FOREIGN PATENT DOCUMENTS

CN 203950036 U 11/2004
CN 1716695 A 1/2006
(Continued)

OTHER PUBLICATIONS

"Arm Cortex - M4, 32-bit processor core,", XMC4500 Microcontroller Series for Industrial Applications, XMC4000 Family, Infineon Microcontrollers, Preliminary Datasheet, V0.8, Nov. 2012, 113 pages.

(Continued)

*Primary Examiner* — Peter M Bythrow
(74) *Attorney, Agent, or Firm* — Slater Matsil, LLP

(57) ABSTRACT

In accordance with an embodiment, a packaged radio frequency (RF) circuit includes a radio frequency integrated circuit (RFIC) disposed on a substrate that has plurality of receiver circuits coupled to receive ports at a first edge of the RFIC, and a first transmit circuit coupled to a first transmit port at a second edge of the RFIC. The packaged RF circuit also includes a receive antenna system disposed on the package substrate adjacent to the first edge of the RFIC and a first transmit antenna disposed on the package substrate adjacent to the second edge of the RFIC and electrically coupled to the first transmit port of the RFIC. The receive antenna system includes a plurality of receive antenna elements that are each electrically coupled to a corresponding receive port.

26 Claims, 20 Drawing Sheets

Related U.S. Application Data filed on Aug. 6, 2015, provisional application No. 62/222,058, filed on Sep. 22, 2015.

(51) Int. Cl.

| | |
|---|---|
| *G01S 13/00* | (2006.01) |
| *G01S 13/34* | (2006.01) |
| *G01S 13/87* | (2006.01) |
| *G01S 7/35* | (2006.01) |
| *G01S 13/58* | (2006.01) |
| *G01S 13/93* | (2006.01) |
| *H01Q 9/04* | (2006.01) |
| *H01Q 19/30* | (2006.01) |
| *H01L 23/66* | (2006.01) |
| *G01S 13/02* | (2006.01) |

(52) U.S. Cl.
CPC .......... *G01S 13/343* (2013.01); *G01S 13/584* (2013.01); *G01S 13/87* (2013.01); *G01S 13/931* (2013.01); *H01L 23/66* (2013.01); *H01Q 9/0407* (2013.01); *H01Q 19/30* (2013.01); *G01S 7/038* (2013.01); *G01S 2013/0245* (2013.01); *H01L 2223/6677* (2013.01); *H01L 2224/12105* (2013.01); *H01L 2224/16227* (2013.01); *H01L 2924/15192* (2013.01); *H01L 2924/15311* (2013.01); *H01L 2924/19105* (2013.01)

(56) References Cited

U.S. PATENT DOCUMENTS

| | | | |
|---|---|---|---|
| 6,770,955 B1* | 8/2004 | Coccioli | H01L 23/3128 257/659 |
| 7,049,682 B1* | 5/2006 | Mathews | H01L 23/552 257/659 |
| 7,119,745 B2* | 10/2006 | Gaucher | H01Q 9/26 343/700 MS |
| 7,369,090 B1* | 5/2008 | Beard | H01Q 1/242 257/734 |
| 7,573,420 B2 | 8/2009 | Forstner et al. | |
| 7,692,574 B2 | 4/2010 | Nakagawa | |
| 7,692,588 B2* | 4/2010 | Beer | G01S 7/032 257/690 |
| 8,451,618 B2* | 5/2013 | Boeck | H01L 23/49816 361/761 |
| 8,497,805 B2 | 7/2013 | Rofougaran et al. | |
| 8,937,572 B2 | 1/2015 | Kobayashi et al. | |
| 8,976,061 B2 | 3/2015 | Chowdhury | |
| 9,246,209 B2* | 1/2016 | Han | |
| 9,349,696 B2* | 5/2016 | Lachner | H01Q 1/2283 |
| 9,910,145 B2* | 3/2018 | Boeck | G01S 7/02 |
| 9,921,295 B2 | 3/2018 | Altus et al. | |
| 10,033,367 B2 | 7/2018 | Pavao-Moreira et al. | |
| 10,101,439 B2 | 10/2018 | Yoo | |
| 2004/0238857 A1 | 12/2004 | Beroz et al. | |
| 2005/0001757 A1* | 1/2005 | Shinoda | H01Q 1/3233 342/70 |
| 2006/0001572 A1 | 1/2006 | Gaucher et al. | |
| 2007/0159380 A1* | 7/2007 | Nagaishi | G01S 7/032 342/70 |
| 2007/0200748 A1* | 8/2007 | Hoegerl | H01L 23/3128 342/85 |
| 2008/0029886 A1* | 2/2008 | Cotte | H01L 23/66 257/728 |
| 2008/0106460 A1 | 5/2008 | Kurtz et al. | |
| 2008/0278370 A1 | 11/2008 | Lachner et al. | |
| 2008/0291115 A1* | 11/2008 | Doan | H01Q 1/38 343/893 |
| 2009/0073026 A1 | 3/2009 | Nakagawa | |
| 2009/0085815 A1 | 4/2009 | Jakab et al. | |
| 2009/0184882 A1* | 7/2009 | Jow | H01L 23/3121 343/873 |
| 2009/0315761 A1 | 12/2009 | Walter et al. | |
| 2010/0193935 A1* | 8/2010 | Lachner | H01Q 1/2283 257/693 |
| 2011/0170231 A1* | 7/2011 | Chandrasekaran | H01L 23/552 361/306.1 |
| 2011/0181459 A1 | 7/2011 | Feger | |
| 2012/0022348 A1 | 1/2012 | Droitcour et al. | |
| 2012/0067871 A1* | 3/2012 | Sherrer | C23C 24/082 219/678 |
| 2012/0104574 A1* | 5/2012 | Boeck | H01L 23/49816 257/660 |
| 2012/0119932 A1* | 5/2012 | MacDonald | H01Q 1/425 342/1 |
| 2012/0195161 A1 | 8/2012 | Little et al. | |
| 2013/0027240 A1 | 1/2013 | Chowdhury | |
| 2013/0106673 A1 | 5/2013 | McCormack et al. | |
| 2013/0112754 A1* | 5/2013 | Ikemoto | G06K 7/10336 235/488 |
| 2014/0070994 A1 | 3/2014 | Schmalenberg et al. | |
| 2014/0145883 A1 | 5/2014 | Baks et al. | |
| 2016/0018511 A1 | 1/2016 | Nayyar et al. | |
| 2016/0103213 A1 | 4/2016 | Ikram et al. | |
| 2016/0131740 A1 | 5/2016 | Yoo | |
| 2016/0252607 A1 | 9/2016 | Saboo et al. | |
| 2016/0291130 A1 | 10/2016 | Ginsburg et al. | |
| 2016/0327633 A1 | 11/2016 | Kumar Y B et al. | |
| 2017/0054449 A1 | 2/2017 | Mani | |
| 2017/0315214 A1 | 11/2017 | Steinbuch et al. | |

FOREIGN PATENT DOCUMENTS

| | | |
|---|---|---|
| CN | 101490578 A | 7/2009 |
| CN | 101585361 A | 11/2009 |
| CN | 103529444 A | 1/2014 |
| DE | 102011075725 A1 | 11/2012 |
| GB | 2247799 A | 3/1992 |
| JP | 2001174539 A | 6/2001 |
| JP | 2004506207 A | 2/2004 |
| JP | 2004198312 A | 7/2004 |
| JP | 2006234513 A | 9/2006 |
| JP | 2008029025 A | 2/2008 |
| JP | 2008089614 A | 4/2008 |
| JP | 2009069124 A | 4/2009 |
| JP | 2011259181 A | 12/2011 |
| JP | 2012112861 A | 6/2012 |
| JP | 2013521508 A | 6/2013 |
| JP | 2014055957 A | 3/2014 |
| KR | 20090063166 A | 6/2009 |
| KR | 20140082815 A | 7/2014 |
| WO | 2004080134 A2 | 9/2004 |

OTHER PUBLICATIONS

Beer, Stefan et al., "Novel Antenna Concept for Compact Millimeter-Wave Automotive Radar Sensors,"IEEE Antennas and Wireless Propagation Letters, vol. 8, Jul. 7, 2009, pp. 771-774.

Chuanhua, Du, "FMCW Radar Range Doppler Processing and Beam Formation Technology,"China Excellent Master Thesis Full-Text Database Information Technology Series, Collections of Master Dissertations, Mar. 15, 2005 7 pages.

Costanzo, Sandra et al. "High Resolution Software Defined Radar System for Target Detection"J. Electrical and computer Engineering vol. 2013, Article ID 573217, Aug. 25, 2013, 7 pages.

Kwag, Young-Kil, et al. "Modern Software Defined Radar (SDR) Technology and Its Trends," Journal of Electromagnetic Engineering and Science, vol. 14, No. 4, Dec. 2014, pp. 321-328, doi:10.5515/JKIEES.2014.14.4.321.

Wickert, Mark A., "Phase-Locked Loops with Applications,"ECE 5675/4675 Lecture Notes, Fall Semester 2004, 46 pages.

\* cited by examiner

RF SYSTEM WITH AN RFIC AND ANTENNA SYSTEM

This application claims the benefit of U.S. Provisional Application No. 62/096,421, filed on Dec. 23, 2014, the benefit of U.S. Provisional Application No. 62/201,895, filed on Aug. 6, 2015, and the benefit of U.S. Provisional Application No. 62/222,058, filed on Sep. 22, 2015, which applications are hereby incorporated herein by reference in their entirety.

CROSS-REFERENCE TO RELATED APPLICATIONS

This patent application further relates to the following co-pending and commonly assigned U.S. patent applications: Ser. No. 14/954,198 filed on Nov. 30, 2015, and Ser. No. 14/954,256 filed on Nov. 30, 2015, which applications are hereby incorporated herein by reference in their entirety.

TECHNICAL FIELD

The present disclosure relates generally to an electronic device, and more particularly to a radio frequency (RF) system with an RF integrated circuit (RFIC) and an antenna system.

BACKGROUND

Applications in the millimeter-wave frequency regime have gained significant interest in the past few years due to the rapid advancement in low cost semiconductor technologies such as silicon germanium (SiGe) and fine geometry complementary metal-oxide semiconductor (CMOS) processes. Availability of high-speed bipolar and metal-oxide semiconductor (MOS) transistors has led to a growing demand for integrated circuits for mm-wave applications at 60 GHz, 77 GHz, and 80 GHz and also beyond 100 GHz. Such applications include, for example, automotive radar systems and multi-gigabit communication systems.

In some radar systems, the distance between the radar and a target is determined by transmitting a frequency modulated signal, receiving a reflection of the frequency modulated signal, and determining a distance based on a time delay and/or frequency difference between the transmission and reception of the frequency modulated signal. Accordingly, some radar systems include a transmit antenna to transmit the RF signal, a receive antenna to receive the RF, as well as the associated RF circuitry used to generate the transmitted signal and to receive the RF signal. In some cases, multiple antennas may be used to implement directional beams using phased array techniques.

SUMMARY OF THE INVENTION

In accordance with an embodiment, a packaged radio frequency (RF) circuit includes a radio frequency integrated circuit (RFIC) disposed on a substrate that has plurality of receiver circuits coupled to receive ports at a first edge of the RFIC, and a first transmit circuit coupled to a first transmit port at a second edge of the RFIC. The packaged RF circuit also includes a receive antenna system disposed on the package substrate adjacent to the first edge of the RFIC and a first transmit antenna disposed on the package substrate adjacent to the second edge of the RFIC and electrically coupled to the first transmit port of the RFIC. The receive antenna system includes a plurality of receive antenna elements that are each electrically coupled to a corresponding receive port.

BRIEF DESCRIPTION OF THE DRAWINGS

For a more complete understanding of the present invention, and the advantages thereof, reference is now made to the following descriptions taken in conjunction with the accompanying drawings, in which:

FIG. 2, which includes

FIG. 4, which includes

FIG. 6, which includes

FIG. 9, which includes

FIG. 10, which includes

Figure 1:
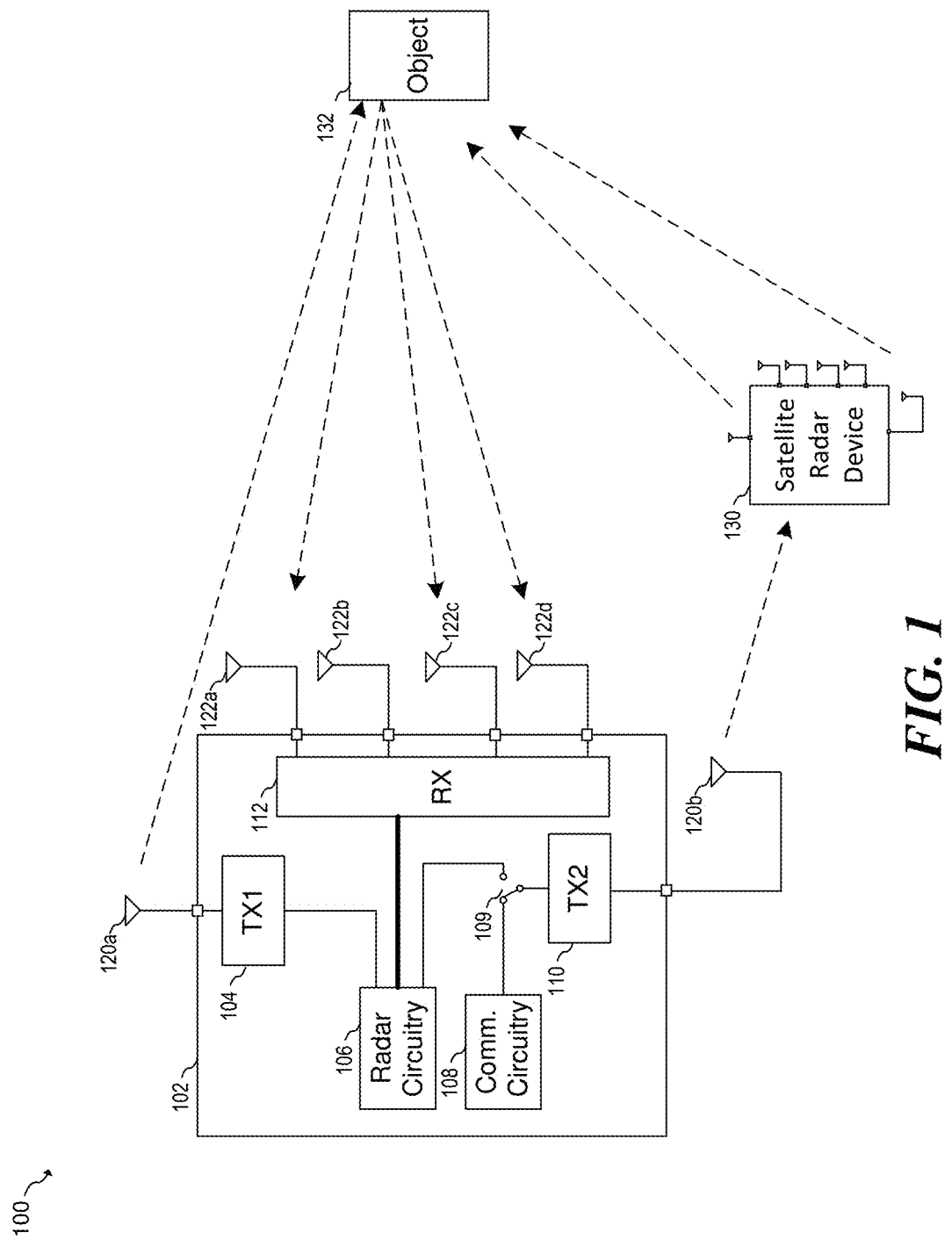
FIG. 1 includes an embodiment radar system.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a radar system, such as radar system used for camera sensing systems and portable consumer devices. The invention may also be applied to other systems and applications, such as general radar systems and wireless communications systems.

In embodiments of the present invention, a high frequency RF system, including RF circuitry and antennas, is implemented in a single ball grid array (BGA) package. The RF system includes an integrated circuit having a receive interface on a first edge of chip and transmit interfaces on adjacent or opposite edges of the chip. A multi-element patch antenna is disposed on a surface of the package adjacent to the first edge of the chip, and is coupled to multiple receive channel interfaces at the first edge of the chip. Similarly, patch antennas for transmitting signals are disposed on the redistribution layer of the package on the adjacent or opposite edges of the chip adjacent to the transmit interfaces. In one embodiment, at least one transmit channel may be used to selectively transmit an incident radar signal or a data signal. In other embodiments of the present invention, the integrated circuit may be mounted directly on a circuit board adjacent to a multi-element patch antenna disposed on the circuit board.

In order to provide isolation between the transmit antennas and the receive antennas, a ground wall is disposed in the package adjacent to the first edge. This ground wall may be implemented using ground layers in the redistribution layer and/or by using an array of solder balls that are grounded. In addition, dummy solder balls may be used to provide mechanical stability to the package in the fan out area, especially in regions of the package adjacent to the patch antennas.

In an embodiment, beam forming concepts, which are widely used in radar systems, may be used to impart beam steering and directionality to the transmission and reception of RF signals. Such embodiments may be applied, for example, to automotive radar, camera systems, portable systems, wearable devices, TV sets, tablet computers, and other applications. For example, in a camera system, the radar system may be used to determine a distance to a photographed object in order to determine focus and exposure settings. This distance may be determined accurately and with high resolution using an embodiment 60 GHz radar system with a bandwidth of between about 2 GHz and 8 GHz, for example, 7 GHz bandwidth. Such distance information may also be used for a smart sensing system where the radar ranging data are merged with camera data.

Embodiment beam forming concepts may also be used to implement a gesture recognition system. In the past, gesture recognition systems have been implemented using optical cameras, pressure sensors, PALs and other devices. By using embodiment radar systems, a gesture recognition system may perform accurate distance measurements, while being conveniently hidden behind an opaque cover made of plastic or other sturdy materials.

FIG. 1 illustrates radar system 100 according to an embodiment of the present invention. As shown, radar transceiver device 102 is configured to transmit an incident RF signal toward object 132 via transmit antenna 120a and/or transmit antenna 120b, and receive a reflected RF signal via an antenna array that includes receive antennas 122a-d. Radar transceiver device 102 includes receiver front end 112 coupled to receive antennas 122a-d, first transmitter front end 104 coupled to transmit antenna 120a and second transmitter front end 110 coupled to transmit antenna 120b. Radar circuitry 106 provides signals to be transmitted to first and second transmitter front ends 104 and 110 and receives and/or processes signals received by receiver front end 112.

In an embodiment, the input to second transmitter front end 110 is selectable between an output of radar circuitry 106 and an output of communication circuitry 108 via a circuit represented by switch 109. When second transmitter front end 110 receives input from radar circuitry 106, both first transmitter front end 104 and second transmitter front end 110 can be used to build a holographic radar. On the other hand, when second transmitter front end 110 receives it input from communication circuitry 108, first transmitter front end 104 provides a radar signal to transmit antenna 120a and second transmitter front end 110 provides a communications signal to transmit antenna 120b. This communications signal may be a carrier modulated signal. In one example, the second transmitter front end 110 may transmit a bipolar phase-shift keyed (BPSK) modulated signal to satellite radar device 130 that contains data. In some embodiments, a data link between radar transceiver device 102 and satellite radar device 130 may be used to coordinate RF transmission and reception between radar transceiver device 102 and satellite radar device 130 to implement phase array beam steering. In some embodiments, satellite radar device 130 may also be capable of data transmission and radar transceiver device 102 may be configured to receive data from satellite radar device 130 via antennas 122a-d.

Figure 2A:
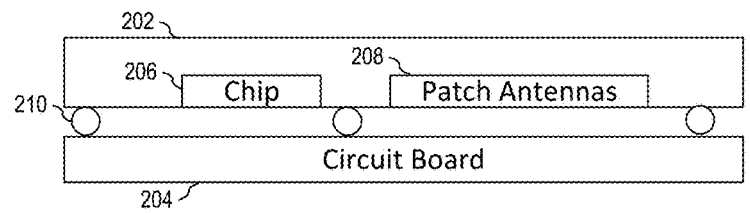
FIGS. 2a-2c, illustrate an embodiment RF system/antenna packages and corresponding circuit boards.

In an embodiment, radar transceiver device 102, or portions of radar transceiver device 102 may be implemented in a package that contains first transmitter front end 104, second transmitter front end 110, receiver front end 112, as well as transmit antennas 120a and 120b and receive antennas 122a-d. FIG. 2a illustrates a cross section of a ball grid array (BGA) package that contains radar circuitry 106 and patch antennas 208 that are used to implement antennas 120a, 120b and 122a-d. In alternative embodiments, other antenna elements may be used besides patch antennas, for example, a Yagi-Uda antenna may be used provide sensing from the side of the packaged chip and antenna module. As shown, packaged chip and antenna module 202 is coupled to circuit board 204 via solder balls 210.

In an embodiment, the frequency of operation of radar system 100, as well as other embodiments, disclosed herein, is between about 57 GHz and about 66 GHz. Alternatively, embodiment systems may operate at frequencies outside of this range also.

Figure 2B:
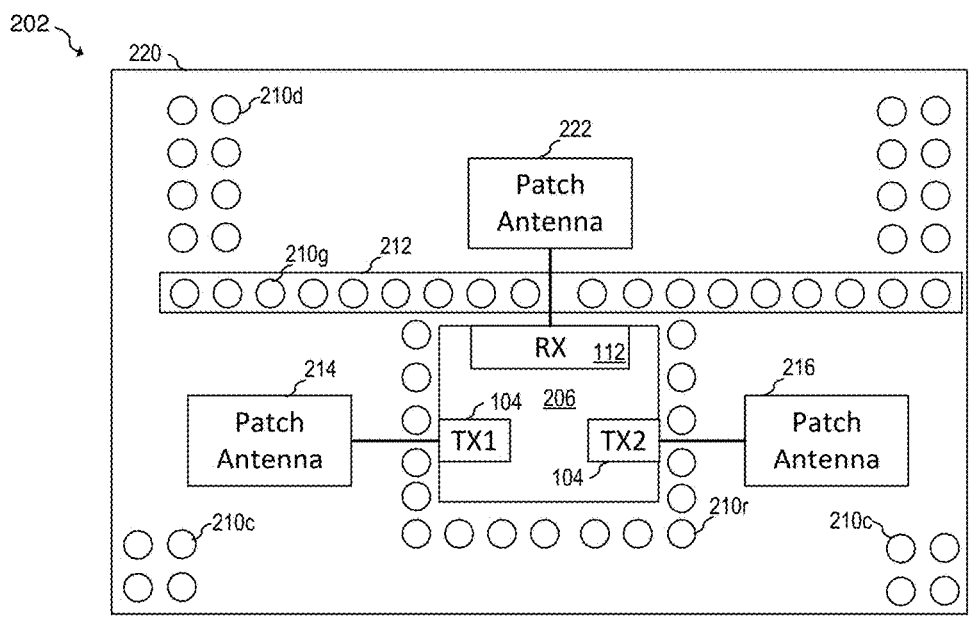

FIG. 2b illustrates a plan view of packaged chip and antenna module 202. As shown RF chip 206 is disposed on package redistribution layer 220 and has receiver front end 112 disposed on a first edge of RF chip 206, first transmitter front end 104 coupled to a second edge that is adjacent to the first edge of RF chip 206, and second transmitter front end 110 coupled to a third edge that is also adjacent to the first edge of radar circuitry 106. Alternatively, a transmitter circuit could also be coupled to a fourth edge opposite the first edge of RF chip 206.

Receive patch antenna 222 is positioned on the same side as the first edge of RF chip 206, but is separated by ground wall 212 that provides isolation between receive patch antenna 222 and RF chip 206, and between receive patch antenna 222 and transmit patch antennas 214 and 216. Ground wall 212 may be implemented, for example, using grounded solder balls 210g, and/or via grounded conductive layers within package redistribution layer 220. As shown, transmit patch antenna 214 is coupled to first transmitter front end 104 and is disposed adjacent to the same edge of RF chip 206 as first transmitter front end 104. Similarly, transmit patch antenna 216 is coupled to first transmitter front end 104 and is disposed adjacent to the same edge of RF chip 206 as first transmitter front end 104.

Dummy solder balls 210*d* are disposed in the fan out area of the package adjacent to receive patch antenna 222 and provide mechanical stability to packaged chip and antenna module 202. Similarly, corner solder balls 210*c* provide mechanical stability to the package, as well as providing support to the corners of package redistribution layer 220 when packaged chip and antenna module 202 is installed on and soldered to a printed circuit board (PCB). In some embodiment, dummy solder balls 210*d* and corner solder ball 210*c* alleviate mechanical stress on connection solder balls 210*r* that provide electrical connections to RF chip 206, thereby allowing package redistribution layer 220 to withstand various mechanical stresses, such as repeated temperature cycling.

Figure 2C:
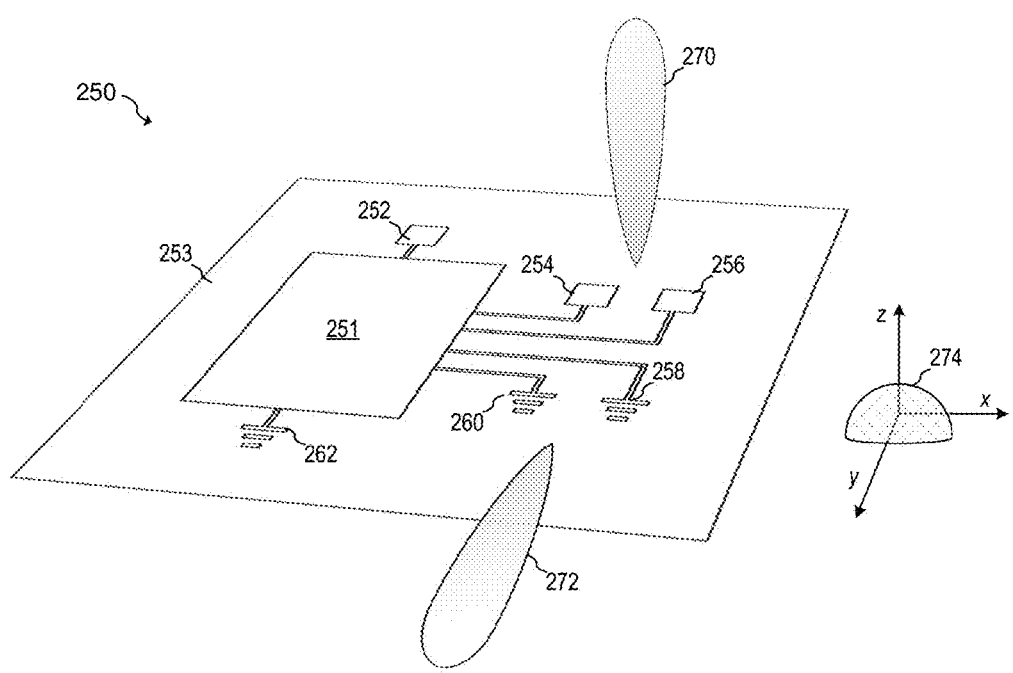

FIG. 2*c* illustrates an embodiment radar transceiver device 250 that includes RF chip 251 disposed on redistribution layer or substrate 253. Transmit receive patch antenna 252 and receive patch antennas 254 and 256 are coupled to RF chip 251 and have radiation pattern 270 in the z direction. In addition, transmit receive Yagi-Uda antenna 252 and receive Yagi-Uda antennas 258 and 260 are coupled to RF chip 251 and have radiation pattern 272 in the y direction. In some embodiments, receive patch antennas 254 and 256 and Yagi-Uda antennas 258 and 260 combine to form a "half-ball" radiation pattern 274.

Figure 3:
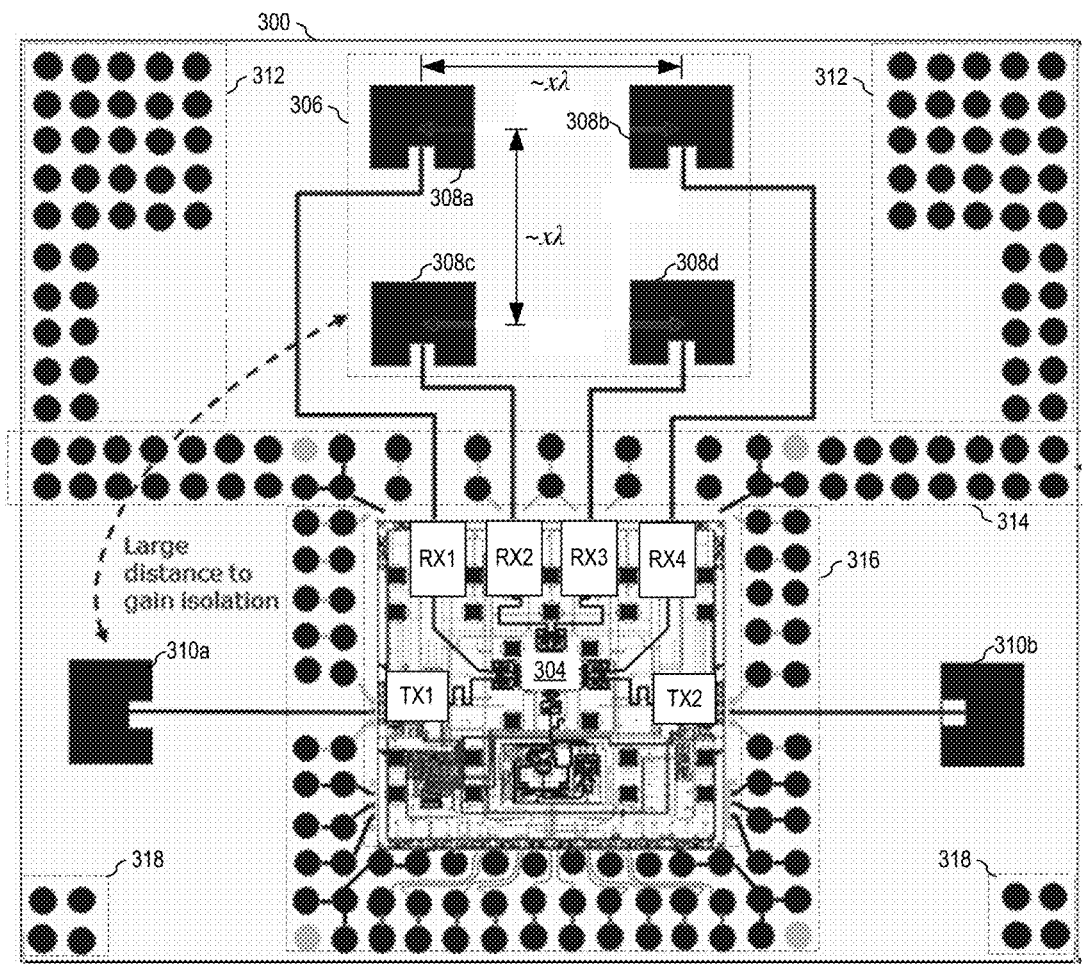
FIG. 3 illustrates a plan view of an embodiment RF system/antenna package.

FIG. 3 illustrates package substrate 300 according to another embodiment of the present invention. As shown, RF chip 304 is disposed on package substrate 300, and is coupled to transmit patch antenna 310*a* and transmit patch antenna 310*b* via transmit circuits TX1 and TX2, respectively. Receive patch antenna system 306 that includes receive patch antennas 308*a-d* is coupled to receive circuits RX1, RX2, RX3 and RX4 on RF chip 304. As shown, the layout of package substrate 300 provides isolation between receive patch antenna system 306 and transmit patch antennas 310*a* and 310*b* by geometrically spacing the antennas apart and by isolating the antennas via ground wall 314. In an embodiment, ground wall 314 is implemented using an array of grounded solder balls.

In addition to solder balls 316 that provide electrical connections to RF chip 304, dummy solder balls 312 disposed adjacent to receive patch antenna system 306 and corner dummy solder ball 318 provide mechanical stability to the package, as well as providing additional mechanical connections and alignment ability to the board to which package substrate 300 is soldered. In one embodiment, the physical dimensions of package substrate 300 are about 14 mm by 14 mm. Alternatively, package substrate 300 may be a different size.

In an embodiment, receive patch antenna system 306 includes square patch antennas 308*a*, 308*b*, 308*c* and 308*d* that are arranged in a square configuration have centers that are spaced apart some multiple or fraction x of wavelength λ of the signal frequency being transmitted by the RF system. In some embodiments x is between about ½ and about ⅔. Alternatively, x may be outside of this range. In alternative embodiments, greater or fewer than four patch antennas may be used to implement receive patch antenna system 306 depending on the specifications of the particular system.

Figure 4A:
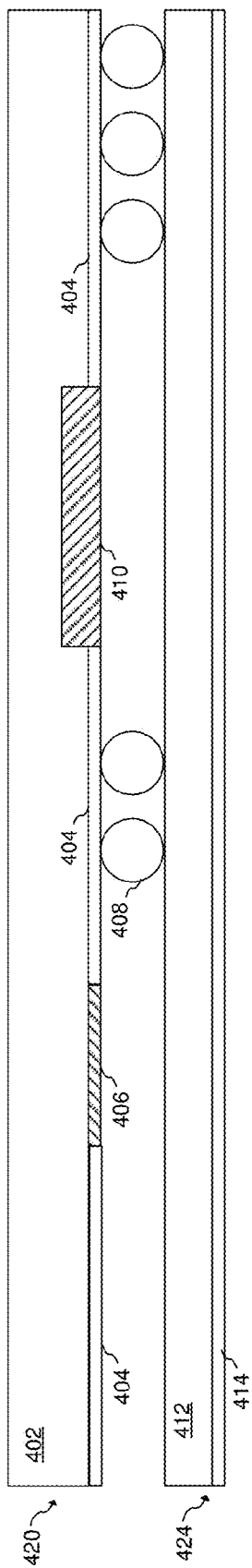
FIGS. 4a, 4b and 4c, illustrates a further embodiment RF system/antenna package and corresponding circuit board.

FIG. 4*a* illustrates a cross-sectional view of an embodiment RF system/antenna package 420 disposed on a circuit board 424. In a specific embodiment directed toward an embedded wafer level ball grid array (eWLB) package, RF system/antenna package 420 includes a molding material layer 402 that is about 450 μm thick and a low temperature coefficient (LTC) layer 404 disposed beneath molding material layer that is about 20 μm thick. Various patch antennas are implemented using a 7.5 μm redistribution layer (RDL) 406. In an embodiment, an RF chip 410 that includes the various transmit and receive circuits is disposed within a cavity within molding material 402. In some embodiments, RF system/antenna package 420 may include further conductive layers used for routing and/or for the implementation of various passive devices within the substrate of the package. In alternative embodiments of the present invention, other package types such as a BGA or Advanced Thin Small Leadless ATSPL package may also be used.

In an embodiment, the RF system/antenna package 420 is mounted on circuit board 424 via solder balls 408. Circuit board 424 may be implemented using FR4 material 412 disposed on copper ground layer 414. Alternatively, other materials such as Rogers PCB material may be used. In some embodiments, circuit board 424 may include additional conductive and insulating layers as known in the art. FR4 material 412 may be about 165 μm thick and copper ground layer 414 may be about 35μ thick in some implementations, however, other thicknesses may be used. In an embodiment, the bottom portion of RF system/antenna package 420 is spaced about 250μ, from the top portion of circuit board 424 in order to provide a large enough gap between the antenna patch and copper ground layer 414. Such spacing may be further enhanced by having copper ground layer 414 as the bottom layer of circuit board 424.

Figure 4B:
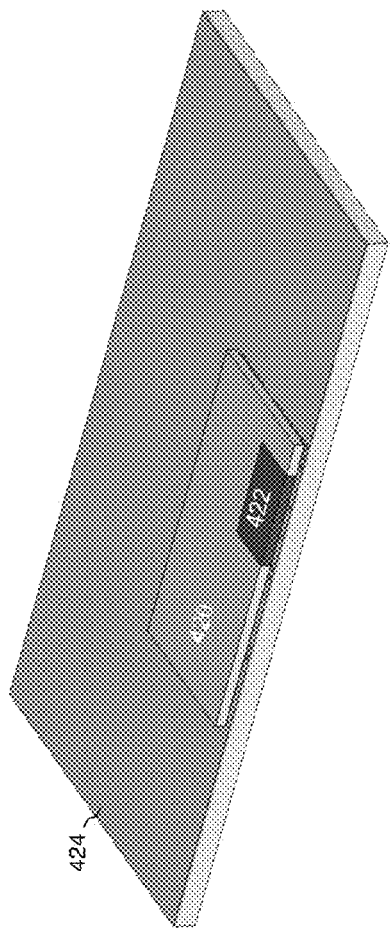
Figure 4C:
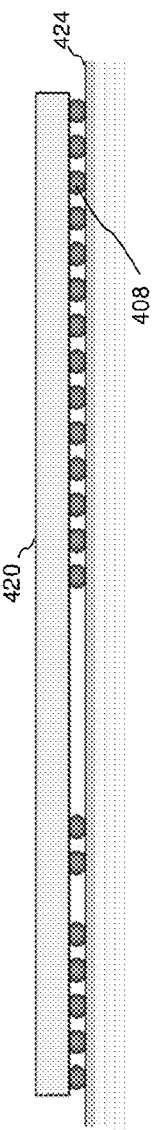

FIG. 4*b* illustrates a cutaway three-dimensional view of RF system/antenna package 420 disposed on circuit board 424. The section of RF system/antenna package 420 that houses chip 410 is denoted as region 422 to show the relative position of chip 410 to the remaining portions of RF system/antenna package 420. FIG. 4*c* illustrates a cross-sectional view of RF system/antenna package 420 mounted on circuit board 424 via solder balls 408.

It should be understood that the various example physical dimensions and the various materials used for the various layers of the RF system/antenna package 420 and the board on which the RF system/antenna package is disposed are only specific examples. In alternative embodiments of the present invention, other physical dimensions and suitable materials may be used for the various layers.

Figure 5:
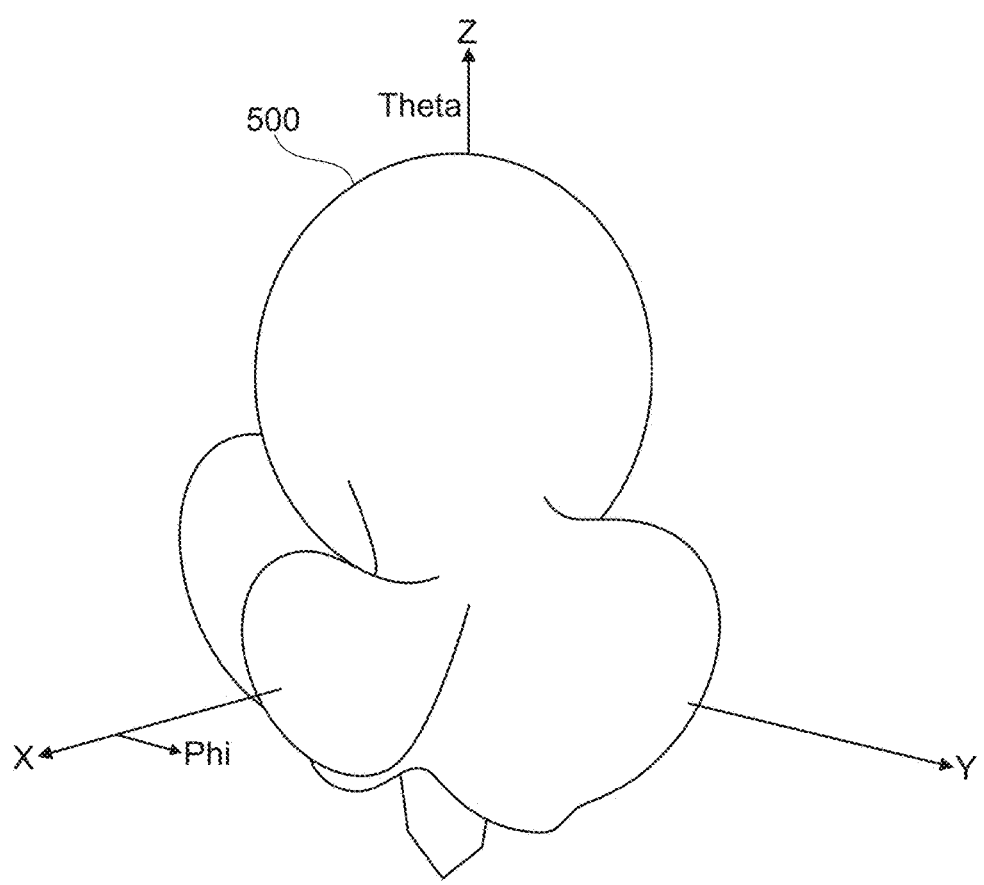
FIG. 5 illustrates an antenna pattern generated by an embodiment patch antenna system.

FIG. 5 illustrates a three-dimensional plot showing the antenna pattern 500 for the embodiment four-element receive antenna system 306 shown in FIG. 3. As shown, the antenna pattern 500 has a main lobe directed in the Z direction and side lobes that intersect the X-axis and Y-axis. In an embodiment, each side lobe corresponds to each of the four receive patch antennas. It should be understood that patch antennas according to alternative embodiments may have different antenna patterns.

Figure 6A:
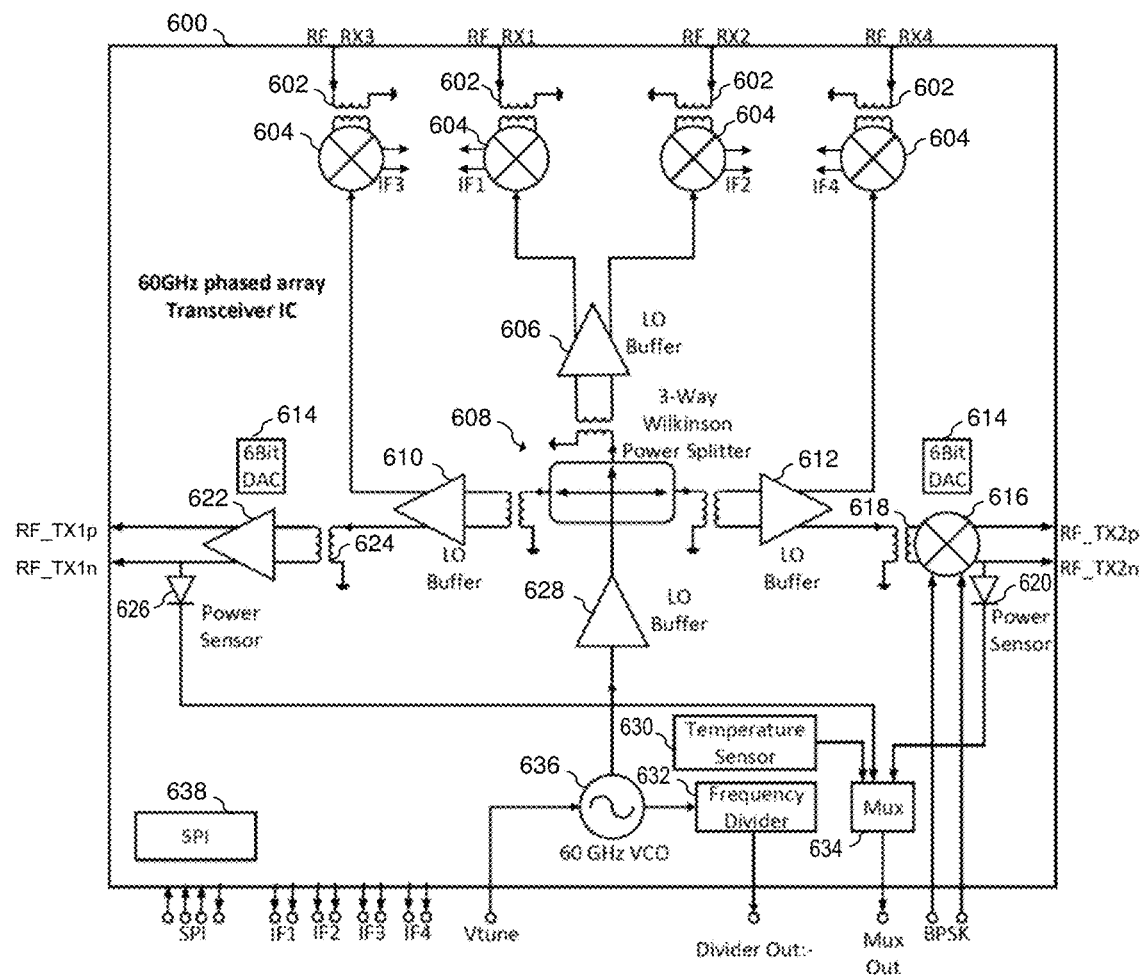
FIGS. 6a and 6b, illustrates a schematic and layout of an embodiment radio frequency integrated circuit (RFIC)

FIG. 6*a* illustrates embodiment RFIC 600 that may be used to implement the RF chips shown in various embodiments described above. In an embodiment, RFIC 600 includes four receive channels disposed along the top edge of RFIC 600, and two transmit channels disposed on the left and right side of RFIC 600, respectively. As shown, each of the respective receive channels include a respective transformer 602 and mixer 604 that downconverts respective RF signals received at pins RF_RX1, RF_RX2, RF_RX3 and RF_RX4 to an intermediate frequency at lines IF1, IF2, IF3 and IF4. A first transmit channel includes transformer 624 and power amplifier 622 that provides a signal to pins RF_TX1*p* and RF_TX1*n*, and a second transmit channel includes transformer 618 and mixer 616. In an embodiment, mixer 616 is activated in order to modulate a carrier using bipolar phase shift keyed (BPSK) data introduced at pins BPSK. Accordingly, mixer 616 may function as a BPSK modulator. In one specific example, a data rate of about 1000 MBs supported using mixer 616. In alternative embodiments, data may be modulated at other data rates and using other modulation schemes. When mixer 616 is not activated, for example, during periods of time in which the second transmit channel provides an incident radar signal, the signal provided by local oscillator (LO) buffer 612 is provided to output pins RF_TX2p and RF_TX2n.

The first and second transmit channels may further include respective power sensors 626 and 620 to measure transmitted power, which may be implemented using power sensor circuits and systems known in the art. Such power sensors may include, but are not limited to diode detectors and logarithmic power detectors. The outputs of power sensor 626 and 620, as well as the output of temperature sensor 630 are selectable at an external pin via multiplexer 634. In some embodiments, the output amplitudes of the first and second transmit channels may be adjusted using digital-to-analog converters 614. Such adjustments to the output amplitudes may be made based on power measured by power sensors 620 and 626.

In an embodiment, the LO signal coupled to the various mixers and transmitters has a frequency of between about 57 GHz and about 66 GHz, however, frequencies outside of this range may also be used depending on the particular embodiment and its specifications. As shown, the LO signal is generated using VCO 636 and is first buffered by LO buffer 628 prior to being split by power splitter 608. As shown, a 3-way Wilkinson power splitter is used; however, in other embodiments the Wilkinson power splitter may split the LO signal into greater or fewer outputs than three. Moreover, other power splitter circuits, systems topologies known in the art may be used. In an embodiment, the frequency of VCO 636 is tuned using an external phase locked loop (PLL) circuit (not shown) via pin Vtune. The output of power splitter 608 is coupled to the output of LO buffers 606, 610 and 612.

Frequency divider 632 may be used to provide a divided output to the external PLL circuit. In one specific embodiment, the divider ratio of frequency divider 632 is selectable between 16 and 8192. Alternatively, other divider ratios may be used depending on the particular application and its specifications. In further alternative embodiments, the remaining PLL components, such as a phase detector and a charge pump, may also be disposed on RFIC 600.

In an embodiment, the various modes and functions of RFIC 600 may be digitally controlled via serial peripheral interface (SPI) 638. Alternatively, other interfaces, such as an I2C interface MIPI/RFFE could be used.

Figure 6B:
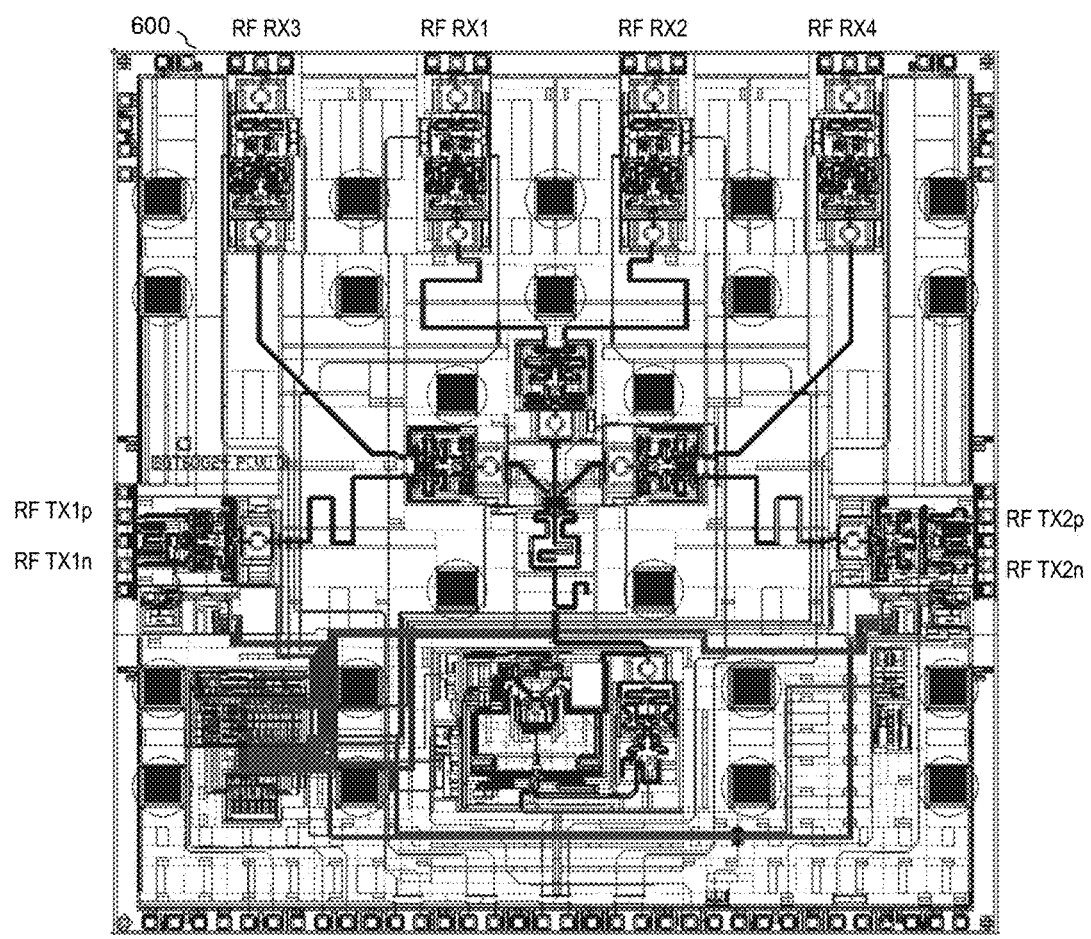

FIG. 6b illustrates an example layout of RFIC 600 that corresponds to the schematic shown in FIG. 6a. In an embodiment, RFIC 600 is implemented in a SiGe process. Alternatively, other processes may be used to implement RFIC 600.

Figure 7:
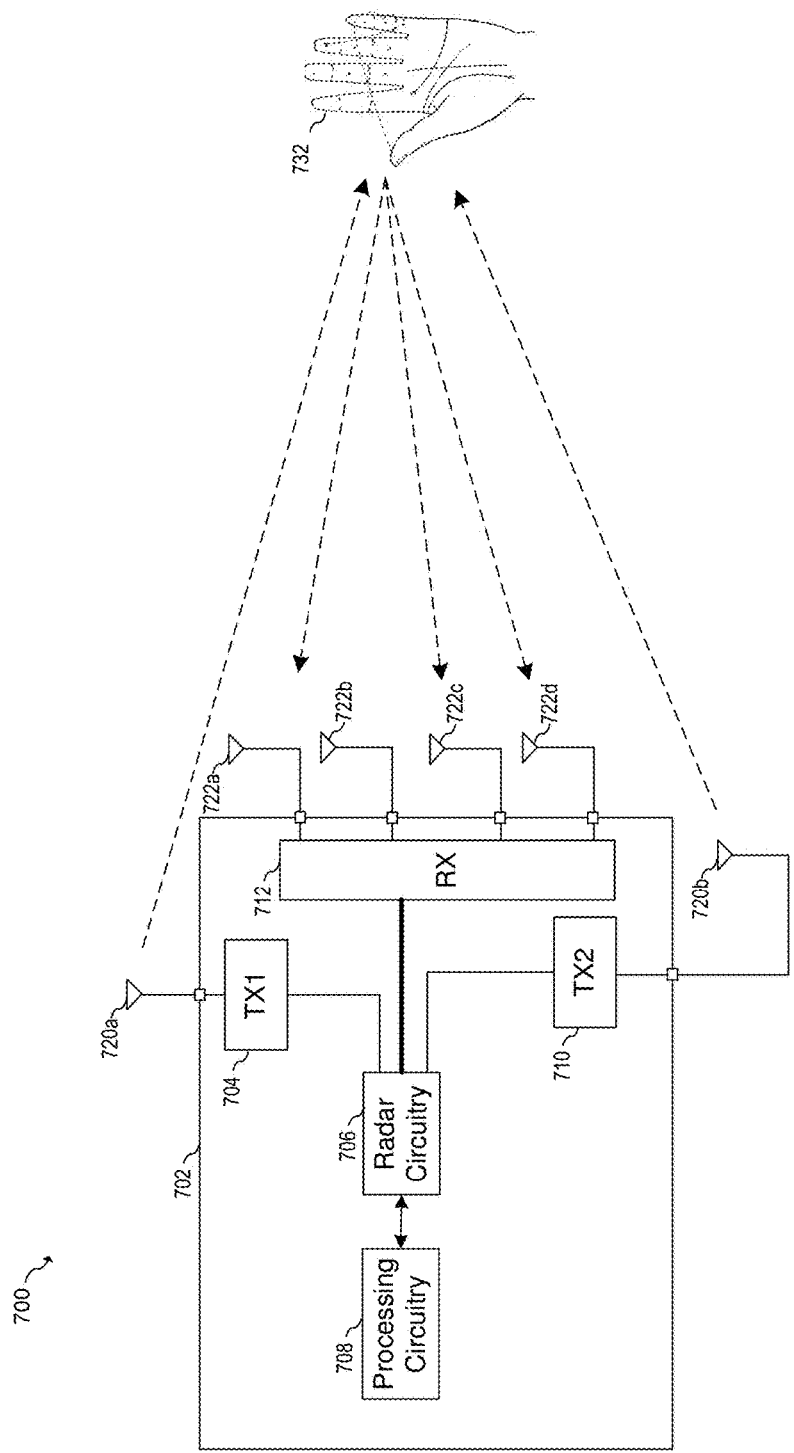
FIG. 7 illustrates a block diagram of an embodiment radar system.

FIG. 7 illustrates an embodiment radar-based gesture recognition system 700 using embodiment concepts. As shown, radar transceiver device 702 is configured to transmit an incident RF signal toward a gesturing hand 732 via transmit antenna 720a and/or transmit antenna 720b, and receive a reflected RF signal via an antenna array that includes receive antennas 722a-d. Radar transceiver device 702 includes receiver front end 712 coupled to receive antennas 722a-d, first transmitter front end 704 coupled to transmit antenna 720a and second transmitter front end 710 coupled to transmit antenna 120b. Radar circuitry 706 provides signals to be transmitted to first and second transmitter front ends 704 and 710 and receives signals via receiver front end 712. Processing circuitry 708 processes the received signals, as well as controlling the transmissions produced by first transmitter front-end 704 and second transmitter front end 710. In some embodiments, radar-based gesture recognition system 700 is implemented as a frequency modulated continuous wave (FMCW) radar sensor having two transmit channels and four receive changes to realize a digital beam forming holographic radar such that a relative speed, distance, and phase of each target in the field of view (FOV) in front of the antennas is measured.

During operation, the position and gestures of hand 732 may be detected by radar transceiver device 702 and/or other processing circuitry coupled thereto. For example, radar transceiver device 702 may be coupled to a computer system, appliance, or other device, and the detected gestures may be used as input to the computer system or various device. For example, a gesture of two fingers tapping each other could be interpreted as a "button press," or a gesture of a rotating thumb and finger may be interpreted as a turning a dial.

Similar to other embodiments described herein, radar transceiver device 702, or portions of radar transceiver device 702 may be implemented in a package that contains first transmitter front end 704, second transmitter front end 710, receiver front end 712, as well as transmit antennas 720a and 720b and receive antennas 722a-d. In some embodiments, radar transceiver device 702 may be implemented as one or more integrated circuits disposed on a circuit board, and transmit antennas 720a and 720b and receive antennas 722a-d may be implemented on the circuit board adjacent to the integrated circuits.

Figure 8A:
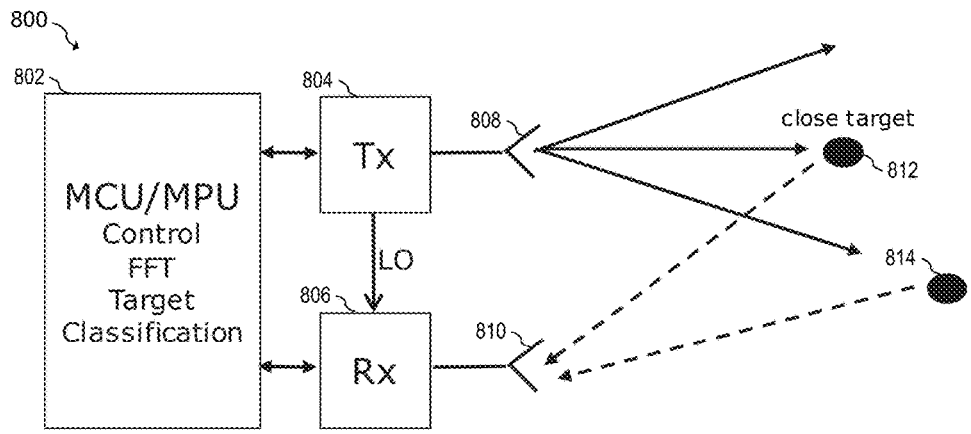
FIG. 8, which includes FIGS. 8a, 8b, 8c and 8d provide diagrams that illustrate the operation of a frequency modulated continuous wave (FMCW) radar system.

FIGS. 8a-8d illustrate the fundamental operation of an FMCW radar. FIG. 8a illustrates a simplified diagram of an FMCW radar system 800 that includes processor 802, transmit circuit 804, transmit antenna 808, receive circuit 806 and receive antenna 810. During operation, transmit circuit 804 transmits a RF signal having a variable frequency that is reflected by close target 812 and far target 814. The reflected RF energy is received by antenna 810 and receive circuit 806, and the received signal is processed by processor 802, which performs various target classification algorithms known in the art.

Figure 8B:
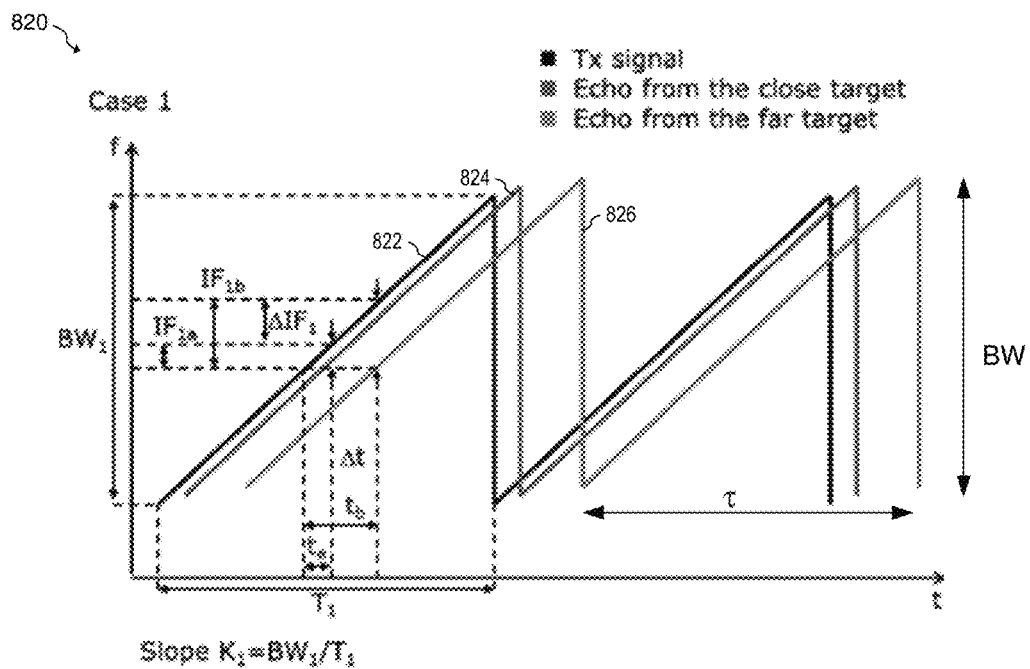

FIG. 8b illustrates a waveform diagram of an FMCW system. Signal 822 represents the frequency of the radar signal transmitted by transmit circuit 804, signal 824 represents the frequency of the signal reflected by close target 812 and signal 826 represents the signal reflected by far target 814. The delay from the transmission of the transmit signal to the receipt of the signal reflected by close target 812 is $t_a$ and the delay from the transmitted signal to the receipt of the signal reflected by far target 814 is $t_b$. These time delays in reception cause a frequency offset between the transmitted signal and the received signal. In various embodiments, the transmitted signal is mixed with the received signal to create an intermediate frequency signal that represents the difference in frequency between the transmitted signal and the received signal. As shown, the difference in frequency from the transmitted signal 822 to the received reflected signal 824 from the close target 812 is $IF_{1a}$ and the difference in frequency from the transmitted signal 822 to the received reflected signal 826 from the far target 814 is $IF_{1b}$. As shown, the bandwidth BW of the FMCW radar system is related to the difference between the maximum and minimum transmitted signal.

Figure 8C:
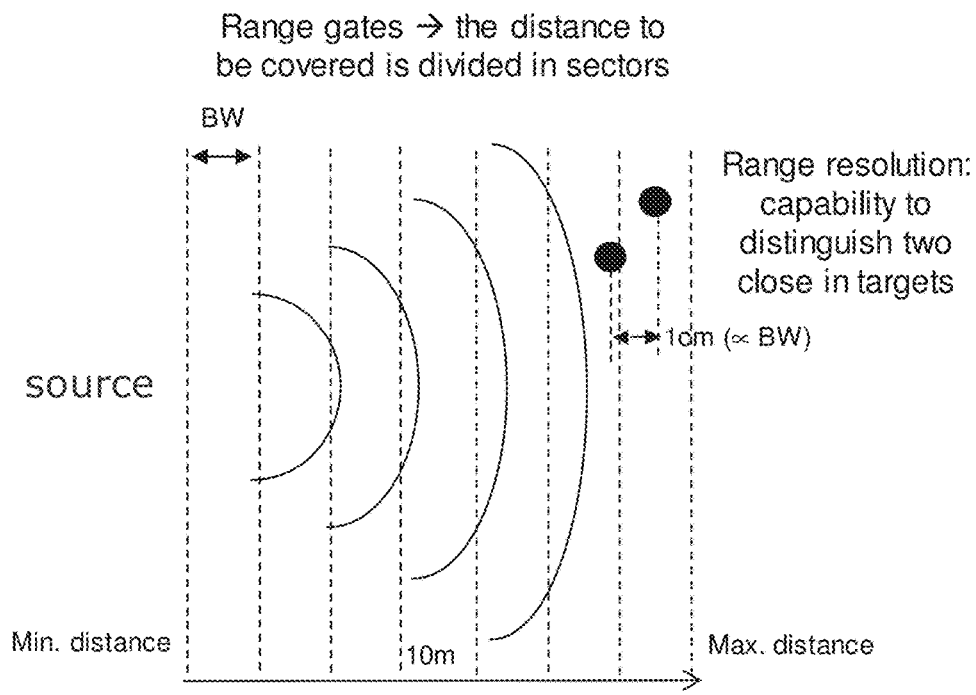
Figure 8D:
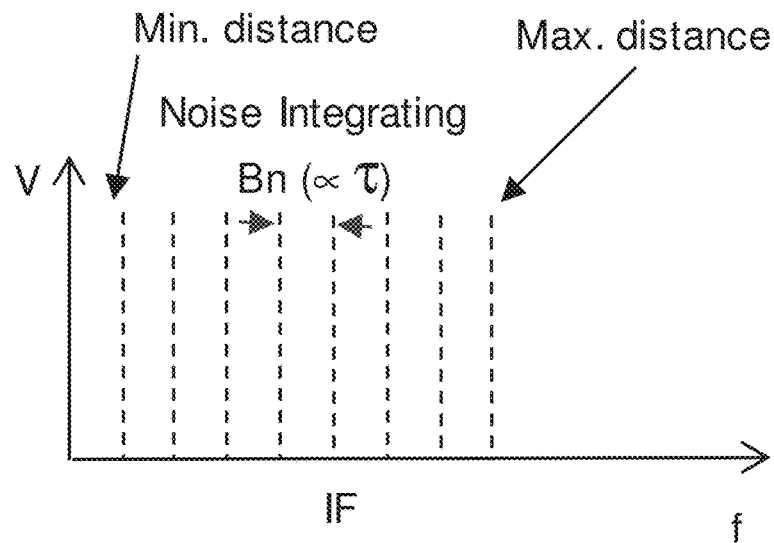

As shown, in FIG. 8c, the resolution of the FMCW system is related to the above-mentioned bandwidth BW of the system. In particular, the range resolution of can be expressed as:

$$\Delta R = \frac{c}{2BW} = \frac{c}{2\Delta f}, \quad (1)$$

where c is the speed of light and Δf is the different between the minimum and maximum frequency of the ramped frequency. In embodiments, the minimum distance between two close targets that can be distinguished is ΔR. As shown in FIG. 8d, the minimum and maximum distance that can be discerned by embodiments FMCW systems is 50 cm and 5 m, respectively.

Figure 9A:
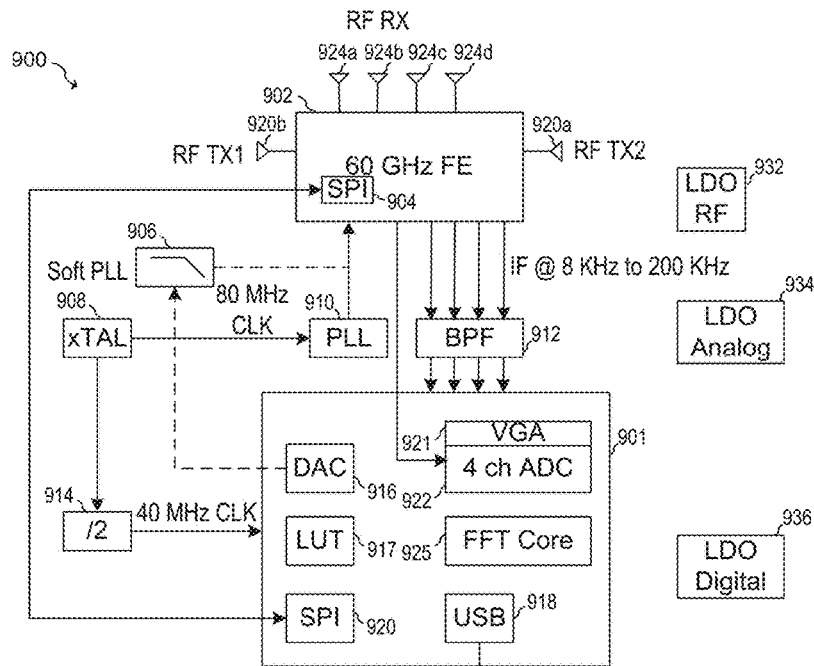
FIGS. 9a, 9b, 9c and 9d illustrate block diagrams of embodiment radar systems and an embodiment antenna configuration.

FIG. 9a illustrates a block diagram of embodiment radar system 900 that may be used, for example, in an embodiment gesture recognition system. As shown, radar system 900 includes an RF front end 902 coupled to a baseband processing circuit 901. The receive path of radar system 900 includes receive antennas 924a-d, a receive signal path within RF front end 902, bandpass filter 912 and a four channel analog-to-digital converter (ADC) within baseband processing circuit 901 that digitizes the output of bandpass filter 912. This digitized receive signal may be further processed by FFT core 925 and various other digital signal processing elements within baseband processing circuit 901.

The transmit path includes clock generation circuits that may be shared between various elements of radar system 900, as well a transmit antennas 920a and 920b. In one embodiment, a swept frequency signal is generated using phase locked loop (PLL) circuit 910 to control an on-board VCO within RF front end 902. As shown, PLL 910 is referenced to crystal oscillator 908, which also provides a clock to baseband processing circuit 901 via clock divider 914. In an alternative embodiment, a software PLL implemented within baseband processing circuit 901 controls the frequency of the on-board VCO within RF front-end 902 via digital-to-analog converter (DAC) 916 and lowpass filter and/or integrator 906. Separate voltage regulators 932, 934 and 936 may be used to provide a regulated power supply voltage for RF front end 902, analog circuitry within baseband processing circuit 901 and digital circuits within baseband processing circuitry 901, respectively.

In an embodiment, RF front end 902 may be implemented using packaged RF systems/antenna packages described herein. For example, an RFIC according to the embodiment of FIGS. 6a and 6b may be disposed within an embodiment packaged antenna or may be mounted on a circuit board having patch antennas.

In an embodiment, radar system 900 uses fast chirps to scan the field of view (FOV). For example, the frequency generation circuitry of radar system 900 may be configured to sweep 7 GHz in 125 us. Alternatively, other frequency ranges and sweep times may be used. By using relatively fast chirps which may also be referred to as a compressed pulse, a lower peak power may be produced, which makes it easier to meet various emission mask requirements over frequency. Moreover, by using a swept frequency signal, a sharp pulse generator is not used in some embodiments.

As mentioned above, radar system 900 may utilize PLL 910, which may be implemented as a fractional N PLL in some embodiments. In one example, the fractional N PLL is implemented using a 64 GHz VCO followed by a divider having a divide ratio of 16 that produces an output frequency of about 4 GHz. In some embodiments, the VCO and dividers may be implemented within RF front end circuit 902 in a similar manner as RFIC 600 shown in FIG. 6a, and the phase-frequency detector (PFD), charge pump and loop filter are implemented within PLL 910. Alternatively, other VCO frequencies and divider ratios may be chosen taking into account, for example, the minimum divider ratio of the PLL in fractional mode, the PLL loop bandwidth, the highest PFD frequency to lower the in band phase noise and shift the spurs to high freq, the frequency resolution during ramp, and availability of low noise compact high frequency crystal oscillators. In the illustrated embodiment, crystal oscillator 908 produces a frequency of 80 MHz, however, other crystal oscillator frequencies may be used in other embodiments.

In other embodiments, a software PLL may be used. As shown, the software PLL has a loop that includes RF front-end circuit 902 (including a VCO and divider), an ADC 922 that samples the output of the divider of RF front-end 902, a microcontroller that applies an algorithm for tuning frequency linearization, DAC 916 and lowpass filter and/or integrator 906 that provides a tuning voltage for the VCO within RF front-end circuit 902. In some embodiments, RF system 900 may be configured to have both PLL 910, and a software PLL that utilizes DAC 916 and low pass filter and/or integrator 906, such that either one is selected for operation.

In an embodiment in which crystal oscillator 908 produces a clock having an RMS jitter of about 2 ps at 80 MHz, the divider ratio of the prescaler may be selected in a way that the jitter associated to the signal is one order of magnitude larger than the jitter associated to crystal oscillator 908. As such, the jitter of sampling the ADC 922 has a lower impact on performance. In some cases, the divider ratio of the prescaler is selected to be large enough to sensure that the output frequency falls within the bandwidth of the ADC. In one embodiment, a divider ratio of 8172 is used such that the output frequency of the prescaler is in the range of 7 MHz. In some embodiments, the sample rate of ADC 922 may be selected such that an output frequency of RF front-end 902 is undersampled. For example, in an embodiments, an output of 7 MHz is sampled at a sampling rate of about 2 Msps. Alternatively, other divider ratios, output frequencies and sampling frequencies may be used depending on the particular embodiment and it specifications.

In an embodiment, variable gain amplifier (VGA) 921 is coupled between the intermediate frequency (IF) output of RF front-end 902 and ADC 922 in order to scale gain of the IF signal such that the full dynamic range of the IF signal corresponds to a full scale in put of ADC 922. Bandpass filter 912 may be coupled prior to the ADC in order to prevent aliasing and/or to limit the frequency content of the IF signal to a scanning range of interest. For example, in one embodiment, the bandpass filter 912 has a minimum frequency of about 8 KHz and a maximum frequency of about 250 KHz in order to limit the frequency content to a scanning range of interest, such as 5 cm to 1 m. Alternatively, other bandwidths may be used to facilitate other scanning ranges.

In an embodiment, voltage regulators 932, 934 and 936 may be implemented using power supply circuits and systems known in the art. For example, low dropout (LDO) regulators may be used to provide DC voltages of about 3.3 V for various components. In some embodiments, a charge pump may be used to provide higher local voltages. For example, in embodiments that utilize a VCO having a higher tuning voltage, a charge pump may be used to convert a 3.3 V power supply voltage up to 5 V in order to use the full tuning range of the VCO. It should be understood that 3.3 V and 5 V are only illustrative examples and other voltages may be generated in other embodiments systems.

In an embodiment, baseband processing circuit 901 may further include a universal serial bus (USB) interface 918 in order to facilitate communication with embodiment radar system 900. For example, the state of radar system 900 may be set, and measured data may be received using USB interface 918. USB interface 918 may be implemented using USB interface circuits known in the art. Baseband processing circuitry 901 may also include serial peripheral interface (SPI) 920 in order to control RF front end 902 via SPI interface 904, as well as to control other system components such as VGA 921 and PLL 910. Lookup table (LUT) 917 may also be included in baseband processing circuitry 901 in order to quickly determine various antenna configurations of RF front end 902.

In one example, radar system 900 may be configured to have a maximum range $R_{max}$ of about 50 cm by having a modulation bandwidth about 7 GHz, which corresponds to a range resolution about 2 cm according to equation (1) above. Thus, a maximum detection range $R_{max}$ of 50 cm corresponds to 25 range gates.

In an embodiment, the minimum IF frequency and the maximum IF frequencies can be expressed as:

$$IF_{min} = \frac{BW}{\tau} \frac{2\Delta R}{c}, \quad (2)$$

$$IF_{max} = \frac{BW}{\tau} \frac{2R_{max}}{c}, \quad (3).$$

According to equations (2) and (3) above, for a bandwidth of 7 GHz and a sweep time of τ=125 μs, minimum IF frequency $IF_{min}$ is about 8 KHz and maximum IF frequency $IF_{max}$ is about 200 KHz. In some embodiments, minimum IF frequency $IF_{min}$ is selected in order to shift the frequency content of the received signals to be above the 1/f noise corner frequency of the received IF output. In some cases, a lower 1/f noise corner frequency corresponds to slower frequency ramps. Thus, devices having lower 1/f noise corner frequencies, such as SiGe bipolar transistors, may be compatible with embodiment RF systems having lower bandwidths. Conversely, technologies having higher 1/f noise corner frequencies, such as CMOS may be supported using faster ramps and higher bandwidths.

In the present example, a sample rate of 2 Ms/s may be used for the ADCs 922, which provides 10× oversampling ratio to avoid aliasing. Moreover, the IF frequency $IF_{min}$ and maximum IF frequency $IF_{max}$ may be used to shape the bandpass filter 912 that precedes ADCs 922.

On the transmit side, a 7 GHz bandwidth may be implemented using a VCO having a tuning range between about 0.5 V and about 5.5V, and a minimum gain $K_{vco}$ of about 1 GHz/V. The tuning voltage may be produced using DAC 916 and level shifter. In one embodiment, two 12-bit DACs operating at 5 Ms/s are used to provide a tuning voltage for the VCO. At 5 Ms/s, a 125 μs frequency sweep corresponds to about 625 points, or about 1.25 kB to be stored in the LUT of the microcontroller for both 12-bit DACs. Under these assumptions, the frequency step between two adjacent frequency points is about 5.6 MHz. In one embodiment, the time constant of about 130 ns is used for integrator 906.

In a further example, radar system 900 may be configured to have a maximum range $R_{max}$ of about 5 m by having a modulation bandwidth about 7 GHz, which corresponds to a range resolution about 2 cm according to equation (1) above. Thus, a maximum detection range $R_{max}$ of 5 m corresponds to 250 range gates.

According to equations (2) and (3) above, for a bandwidth of 7 GHz and a sweep time of τ=250 μs, minimum IF frequency $IF_{min}$ is about 4 KHz and maximum IF frequency $IF_{max}$ is about 1 MHz. In one example, a sample rate of between about 2 Ms/s and about 2.4 Ms/s may be used for the ADCs 922, which an oversampling ratio of between 2× and 2.4× to avoid aliasing.

On the transmit side, a 7 GHz bandwidth may be implemented using a VCO having a tuning range between about 0.5 V and about 5.5V, and a minimum gain $K_{vco}$ of about 1 GHz/V, where the tuning voltage is provided by two 12-bit DACs operating at 5 Ms/s as in the previous example. Alternatively a bandwidth lower than 7 GHz may be used. For example, in some embodiments, bandwidths of between 2 GHz and 8 GHz may be used. Alternatively, bandwidths outside of this range may also be used depending on the particular system and its specification. At 5 Ms/s, a 250 μs frequency sweep corresponds to about 1250 points, or about 2.5 kB to be stored in the LUT of the microcontroller for both 12-bit DACs. Under these assumptions, the frequency step between two adjacent frequency points is about 2.8 MHz. In one embodiment, the time constant of about 250 ns is used for integrator 906.

It should be understood that the various parameters described above are just a couple of examples of parameters that may be applied to embodiment radar systems. In alternative embodiments, other bandwidths, tuning ranges, IF frequencies, sampling rates, bit resolutions, sweep times, and LUT widths may be used.

Figure 9B:
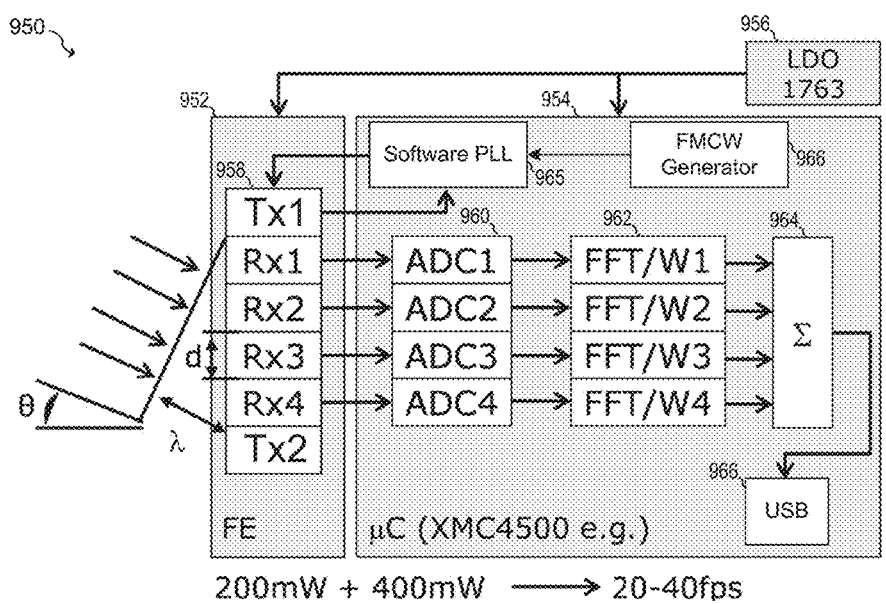

FIG. 9b illustrates a block diagram of an embodiment radar system 950 that shows one way that the system of FIG. 9a may be implemented. As shown, radar system 950 includes an RF front-end 952 coupled to a microcontroller integrated circuit (IC) 954. RF front-end 952 includes a transceiver circuit 958 that includes four receive channels Rx1-Rx4 and two transmit channels Tx1 and Tx2. Alternatively, transceiver circuit 958 may include greater or fewer transmit and/or receive channels. Transceiver circuit 958 may be implemented on a signal integrated circuit or using multiple integrated and/or discrete circuits.

Microcontroller integrated circuit 954 includes ADC circuits 960 that convert the IF output of transceiver 958 from the analog to the digital domain. The digital output of ADC circuits 960 may be routed directly to USB interface 966, or may be routed to digital processing block 962. A summing block 964 may be coupled between digital processing block 962 and USB interface 966. In alternative embodiments, USB interface 966 may be implemented using other types of parallel or serial interfaces such as a low voltage differential signaling (LVDS) or a mobile industry processor interface (MIPI).

In some embodiments, low dropout regulator 956 provides a power supply voltage to RF front-end 952 and microcontroller integrated circuit 954. In various embodiments, microcontroller integrated circuit 954 may be implemented using general purpose or application specific integrated circuits.

During operation, transceiver circuit 958 receives a timing reference from software PLL 965 in order generate a signal of varying frequency for transmission from transmit channels Tx1 and Tx2. This signal of varying frequency may be a ramped sine wave or other suitable signal for radar transmission. In an embodiment, the timing reference may be a control voltage for a VCO (not shown) within RF front-end 952.

In some embodiments, microcontroller integrated circuit 954 may be used to control the RF front-end, a VGA (not shown) coupled between the transceiver circuit 958 and ADC circuits 960, the software PLL 965. Alternatively, the VGA may be disposed on an external circuit or on RF front-end 952. In various embodiments, microcontroller integrated circuit 954 may also be configured to control other circuits disposed on a system board that houses other components of the embodiment radar system.

Microcontroller integrated circuit 954 may be implemented using a general purpose integrated circuit, or may be implemented using an application specific integrated circuit. In various embodiments, microcontroller integrated circuit 954 may include firmware that is stored in a programmable non-volatile memory, such as flash memory. This firmware may be used, for example, to configure radar system 950 during operation, and may be used to enable the functionality that generates the raw data of the radar system 950.

In an embodiment, transceiver circuit 958 is coupled to an antenna array, and is configured to provide a directional beam using phase array techniques known in the art. For example, various delays may be applied to the reception of receive channels Rx1 to Rx4. The reception angle θ is based on the relative delays between each receive channel, the wavelength λ of the received signal, and the distance d between antenna elements. In some embodiments, microcontroller integrated circuit 954 includes a FMCW generator coupled to software PLL that implements frequency generation of the various embodiment FMCW schemes described herein.

Figure 9C:
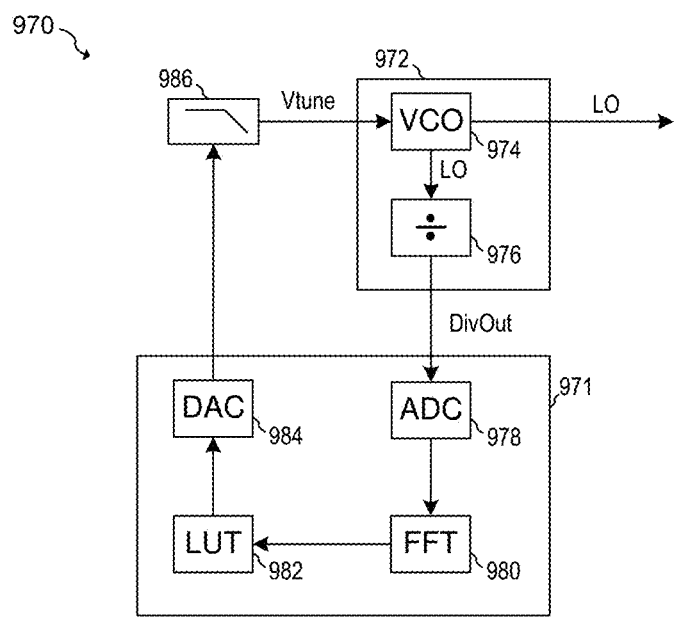

FIG. 9c illustrates a block diagram of a software PLL 970 that may be used in various embodiment RF systems. Software PLL includes a high frequency portion 972, baseband portion 971 and external lowpass filter 986. In various embodiments, high frequency portion 972 may be implemented on a front-end integrated circuit such as RF front-end 902 shown in FIG. 9a, and baseband portion 971 may be implemented on a baseband circuit such as baseband processing circuit 901. During operation, VCO 974 provides a local oscillator output signal LO having a frequency that is set according to input voltage Vtune. Local oscillator signal LO is divided using divider 976 to produce divided signal DivOut, which is digitized via ADC 978. The function of ADC 978 may be implemented by using ADC 921 shown in FIG. 9a, for example, by time multiplexing samples or may be implemented using a separate analog-to-digital converter. A Fast Fourier Transform (FFT) 980 is taken of the digitized divider output, and lookup table 982 is used to map the output of FFT to a control voltage to be produced by DAC 984. Lowpass filter 986 may be used to thermal noise and quantization noise from the output of DAC 984 in order to ensure good phase noise performance. In various embodiments, FFT 980 may be implemented using digital signal processing hardware and software known in the art.

In one embodiment that utilizes a software PLL, the following assumption is made regarding the phase noise of a 60 GHz VCO:

PNssb@10 kHz=−50 dBc/Hz;

PNssb@100 kHz=−80 dBc/Hz;

PNssb@1 MHz=−100 dBc/Hz; and

PNssb@10 MHz=−120 dBc/Hz.

Figure 9D:
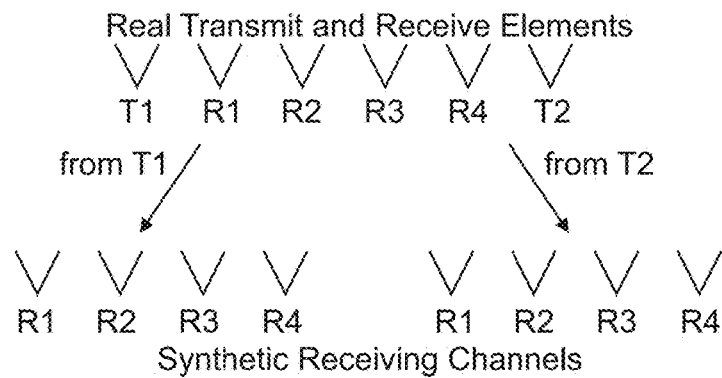

As shown in FIG. 9d, synthetic receiving channels may be implemented by transmitting a radar signal from transmit antennas T1 and T2 at separate times. For example, during a first time period, a first radar signal is transmitted over antenna T1 and not over antenna T2, and the resulting reflected signal is captured by antenna elements R1, R2, R3 and R4 for form a first set of received signals. During a second time period, a second radar signal is transmitted over antenna T2 and not over antenna T1, and the resulting reflected signal is captured by antenna elements R1, R2, R3 and R4 for form a second set of received signals. Because of the spatial difference between antennas T1 and T2, the first and second set of received signals may be combined to produce spatial information of the various targets being sensed and monitored by the embodiment radar system.

Figure 10A:
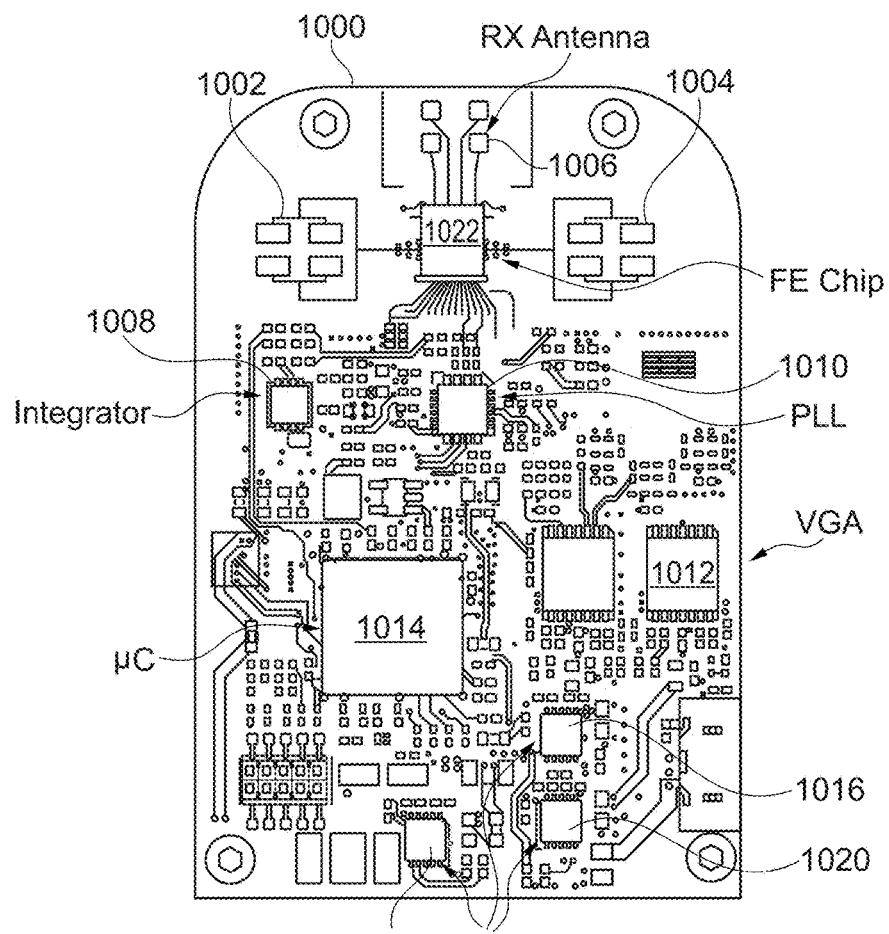
FIGS. 10a, 10b, 10c and 10d illustrates circuit boards of various embodiment radar systems.

FIG. 10a illustrates a circuit board 1000 of an embodiment radar system on which transmit patch antenna 1002 and 1004 and receive patch antennas 1006 are disposed on the circuit board. In some embodiments, circuit board 1000 may be implemented using a low $\varepsilon_r$ PCB material such as Rogers 3003 series PCB material. Also shown on circuit board 1000 is RF front-end IC 1022, PLL IC 1010, integrator IC 1008 that may be used to support PLL IC 1010, VGA 1012, microcontroller 1014 and low dropout voltage regulators 1016, 1018 and 1020. In embodiments in which antennas are used, the ground plane of the layer stack may be optimized in order to cover the complete modulated bandwidth. In various embodiments, the distance between the antenna layer and the ground on the PCB is several hundreds of microns, which enables a gap that provides for sufficient bandwidth and gain for the antenna element. In order to achieve such a gap the ground plane may be placed on the second layer of the PCB. Some embodiment circuit boards may include blind vias underneath RF front-end IC 1022 and around microcontroller 1014 in order to transfer heat to the lower layer of the PCB where conductive layer, such as aluminum, is used to spread the heat generated by the radar circuitry.

Figure 10B:
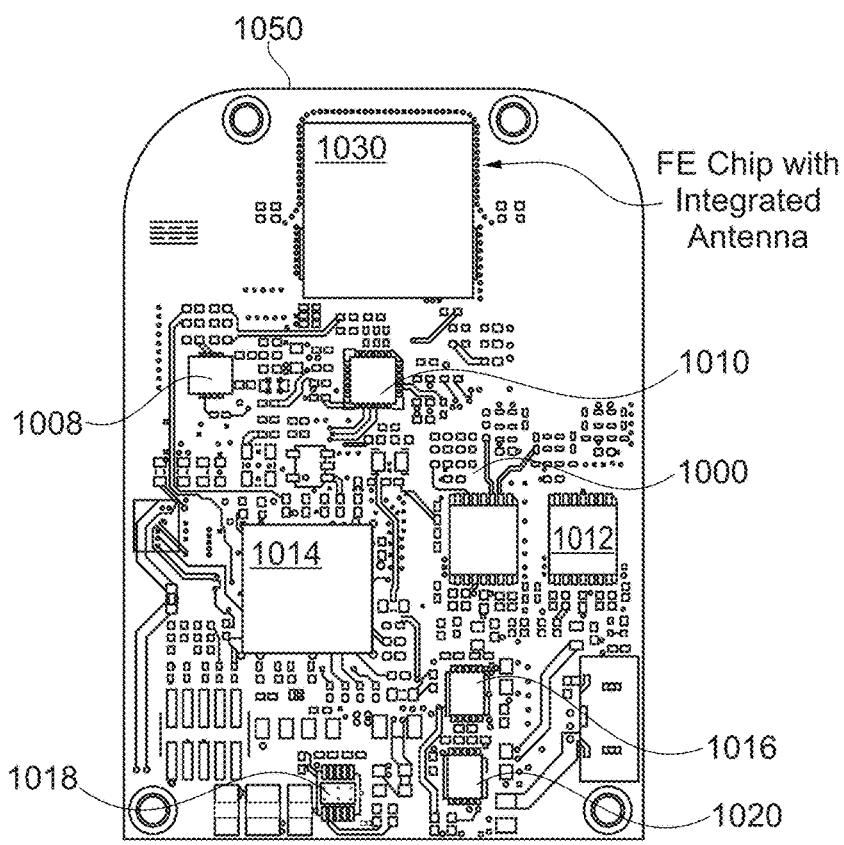
Figure 10C:
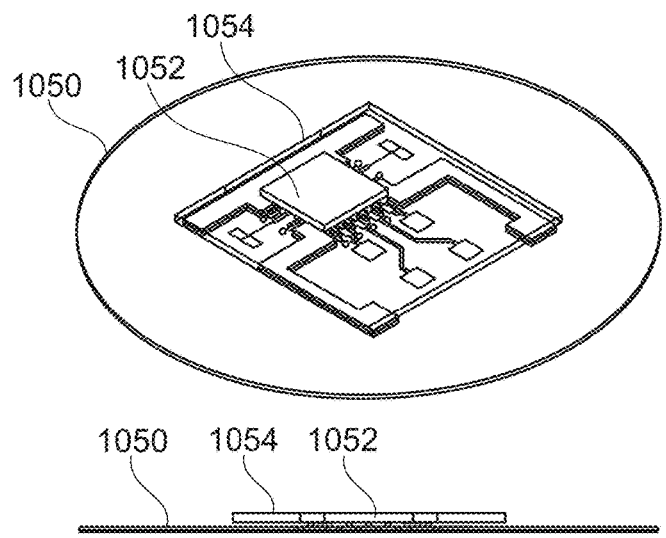

FIG. 10b illustrates a circuit board 1050 of an embodiment radar system in which all patch antennas are embedded within the package 1030 that houses the RF front-end. FIG. 10c illustrates an angled view and a cross section of a circuit board 1050 on which a package 1054 is disposed. In an embodiment, package 1054 includes RF front-end IC 1052 as well as various patch antennas. Such embodiments may apply principles of described hereinabove with respect to the embodiments of FIGS. 2, 3 and 4.

Figure 10D:
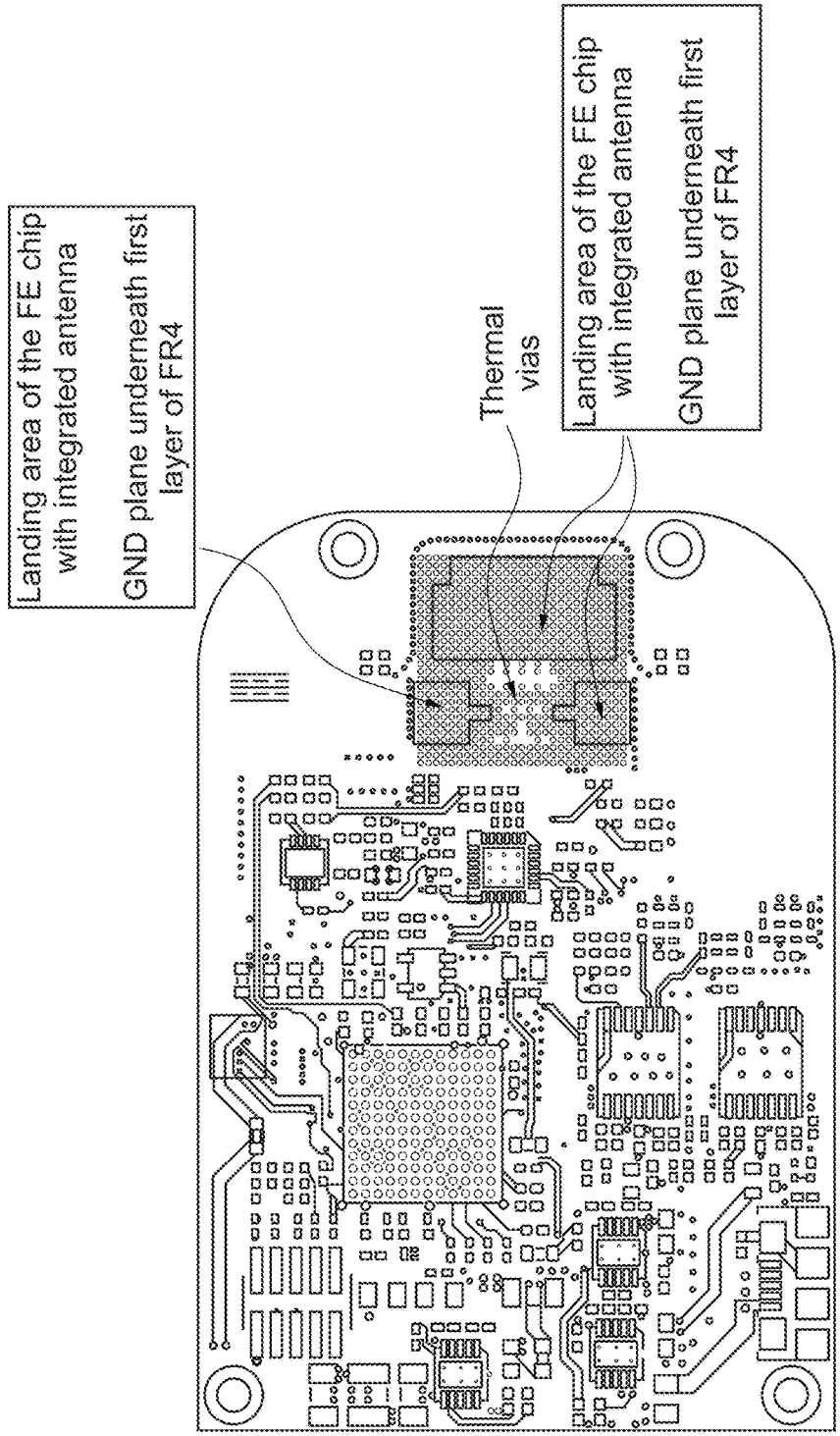

FIG. 10d illustrates a bare circuit board that corresponds to the embodiment of FIG. 10b. As shown, the landing area on which the RF front-end IC is disposed includes ground planes under a first layer of FR4 material, as well as thermal vias.

Figure 11:
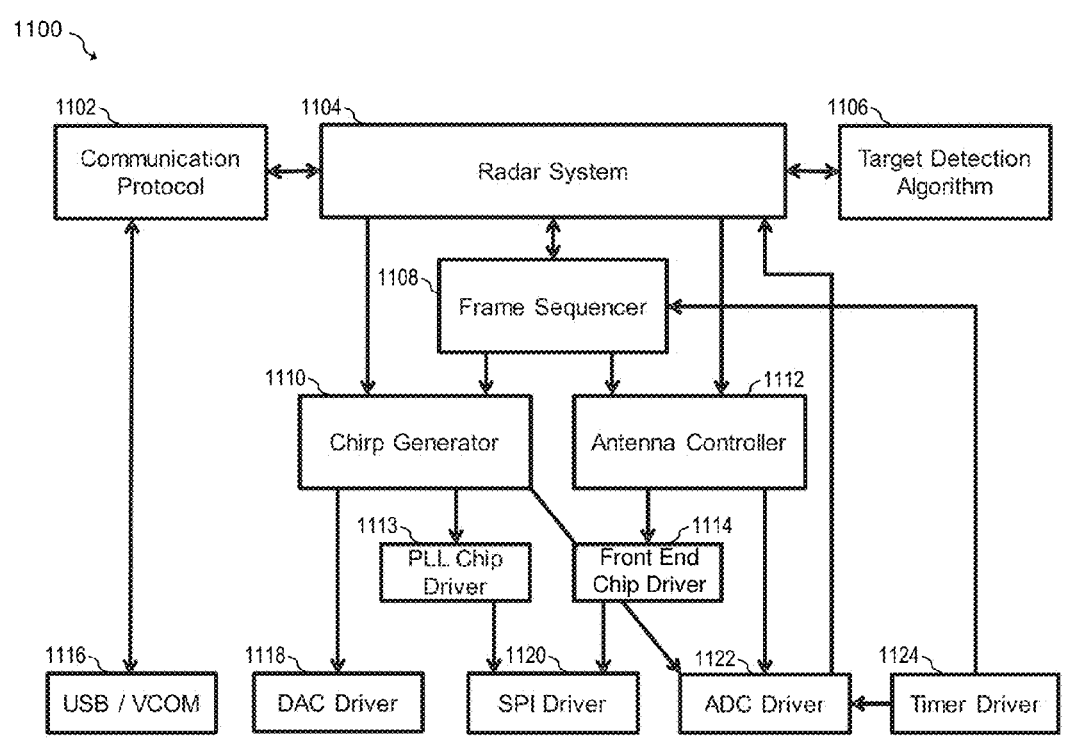
FIG. 11 illustrates a block diagram of an embodiment radar controller.

FIG. 11 illustrates a block diagram of the control architecture 1100 of an embodiment system. In an embodiment, the control architecture may be implemented using a microcontroller, microprocessor, and other control circuitry known in the art. The control architecture may be programmed using software or firmware that is saved on a non-transitory computer readable medium such as non-volatile memory, or may be loaded into volatile memory when the system is powered up.

Radar system 1104 is responsible for the overall flow control and coordination of all firmware modules, and frame sequencer 1108 is used to process chirps and to provide data post processing in real time. Antenna controller 1112 is used to enable the receive and transmit antennas and to provide power control for the analog and RF circuitry within the embodiment radar system. Chirp generator 1110 is configured to control a hardware PLL chip and/or may be configured to DAC data for software chirp generation.

Communication protocol 1102 provides interaction with a host computer and may be configured to format message data, and to check data integrity; and target detection algorithm 1106 provides digital signal processing (DSP) functions for post-processing sampled IF data, and may be configured to detected targets and gestures. Front end chip driver 1114 interfaces with Front end configuration registers and sets up SPI data to be communicated over the SPI interface with the Front end configuration registers. In an embodiment, PLL chip driver 1113 interfaces with the PLL chip configuration register, as well as setting up data to be communicated over the SPI interface to the PLL chip. SPI driver 1120 handles the low level peripheral register settings to send data over the SPI interface, and ADC driver 1122 handles low level peripheral register settings for the ADC, as well as setting up direct memory access (DMA) for the ADC. DAC driver 1118 handles low-level peripheral register settings for the DAC, and timer driver 1124 generates signals at defined intervals for real time processing. Timer driver 1124 may also generate a sample clock for the ADC. USB/VCOM block 1116 handles low-level USB peripheral register settings and implements a USB communication stack.

In various embodiments, control architecture 1100 may control an embodiment radar system in an automatic trigger mode or in a manual trigger mode. In the automatic trigger mode, the controller sets up a sequence of chirps that build a frame and processes the frames at a fixed user defined interval. During operation, raw data is sent to an external host computer and/or the raw data is processed to detect targets and gestures, in which case processed target and gesture data is sent to the external host computer. Reconfiguration of the antenna setup may occur between chirps of a frame.

In an embodiment, the frame sequencer starts operating upon receiving a start command from the external host computer and continues operation until a stop command is received from the external host computer. In some embodiments, the frame sequencer stops automatically after a given number of frames. In order to save power, the controller may partially turn-off RF circuitry between frames.

Figure 12:
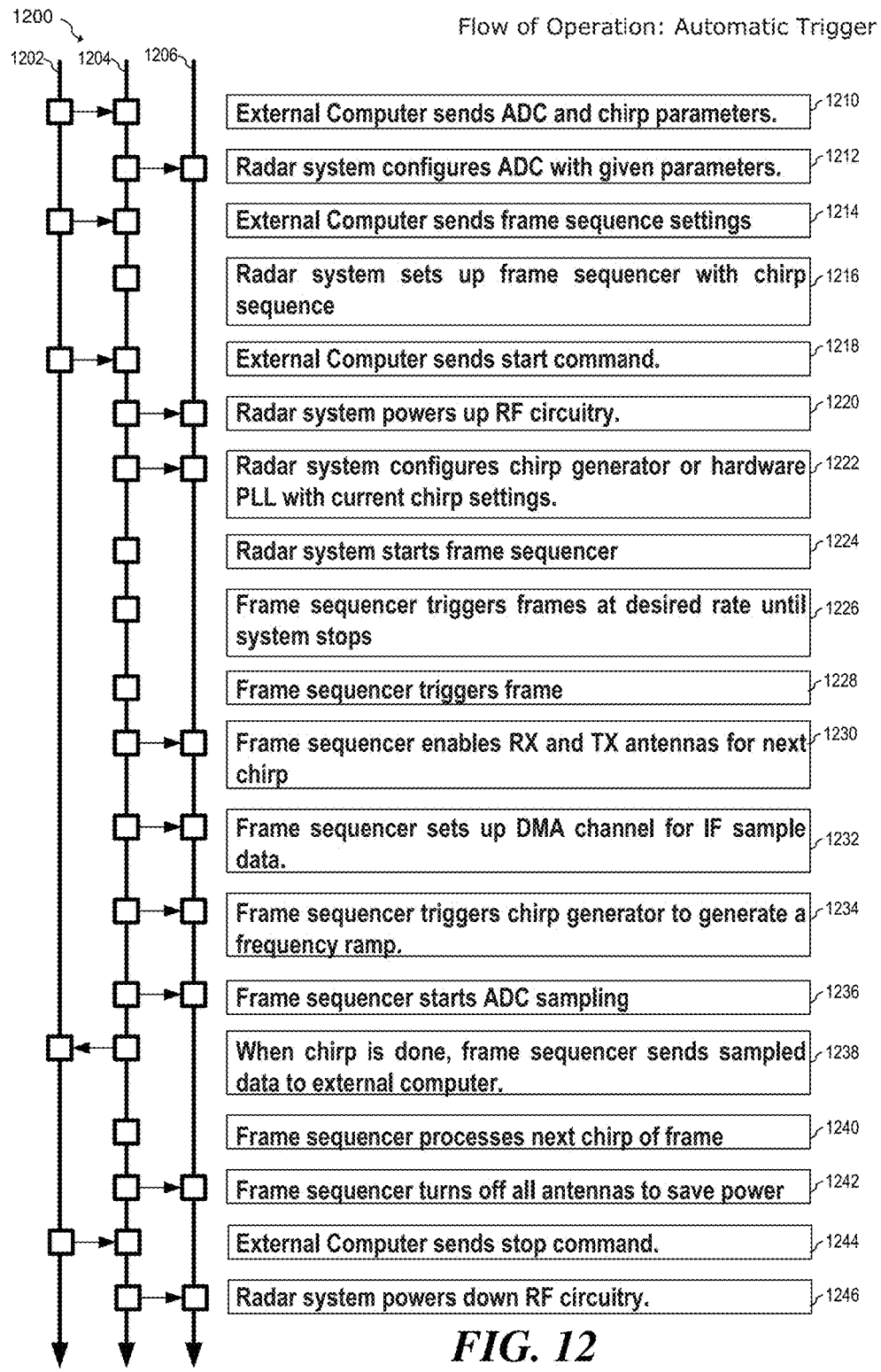
FIG. 12 illustrates a flow chart of an embodiment automatic trigger mode of operation.

FIG. 12 illustrates a flow diagram 1200 of an embodiment automatic trigger mode of operation. Boxes along lines 1202, 1204 and 1206 indicate the flow of data at each step. A box on line 1202 represents activity performed by communication protocol block 1102, and a box on line 1204 represents activity performed by control blocks such as radar system 1104, frame sequencer 1108, antenna controller 1112 and chirp generator 1110. A box on line 1206 represents activity performed by various low-level drivers.

In step 1210, the external computer sends ADC and chirp parameters. The parameters define the operation of the ADC, such as the sample rate, and define the characteristics of the frequency ramp to be transmitted. In step 1212, the radar system 1104 configured the ADC with the given parameters. In step 1214, the external computer send frame sequence settings to frame sequencer 1108, and in step 1216, radar system 1104 sets up frame sequencer 1108 with a chirp sequence that defines the transmitted frequency ramp.

In step 1218, a start command is received from the external computer. Once this start command is received, radar system 1104 powers up RF circuitry in step 1220, configures the chirp generator 1110 or hardware PLL with current chip settings in step 1222 and starts the frame sequencer 1108 in step 1224. Frame sequencer 1108 triggers frames at the desired rate until the system stops (step 1226).

In an embodiment, frame sequencer 1108 triggers frames according to steps 1228 to 1242. In step 1228, frame sequencer 1108 triggers a frame. Receive and transmit antennas are enabled for the next chirp in step 1230, and the frame sequencer 1108 sets up a DMA channel for IF sample data in step 1232. In step 1234, the frame sequencer 1108 triggers the chirp generator 1110 to generate a frequency ramp. Next, frame sequencer 1108 starts the ADC sampling in step 1236. When the chirp is complete, frame sequencer 1108 sends sampled data to the external computer (step 1238), and the next chirp of the frame is processed (step 1240). In some embodiments, frame sequencer 1108 turns off the antennas to save power in step 1242. When a stop command is received from the external computer in step 1244, the radar system powers down the RF circuitry in step 1246.

In an embodiment manual trigger mode, analog RF circuitry is powered-up after a start command from the external host computer. However, in some embodiments, the RF circuit continually powered-up. Chirps are triggered upon receiving a command from the external host computer, and after the chip is complete, sampled IF data is sent to the external host computer. In one embodiment, no processing is applied to the sampled data. The antenna setup may be changed at any time by sending a start command with new settings. The chip setting may be changed at any time in come embodiments.

Figure 13:
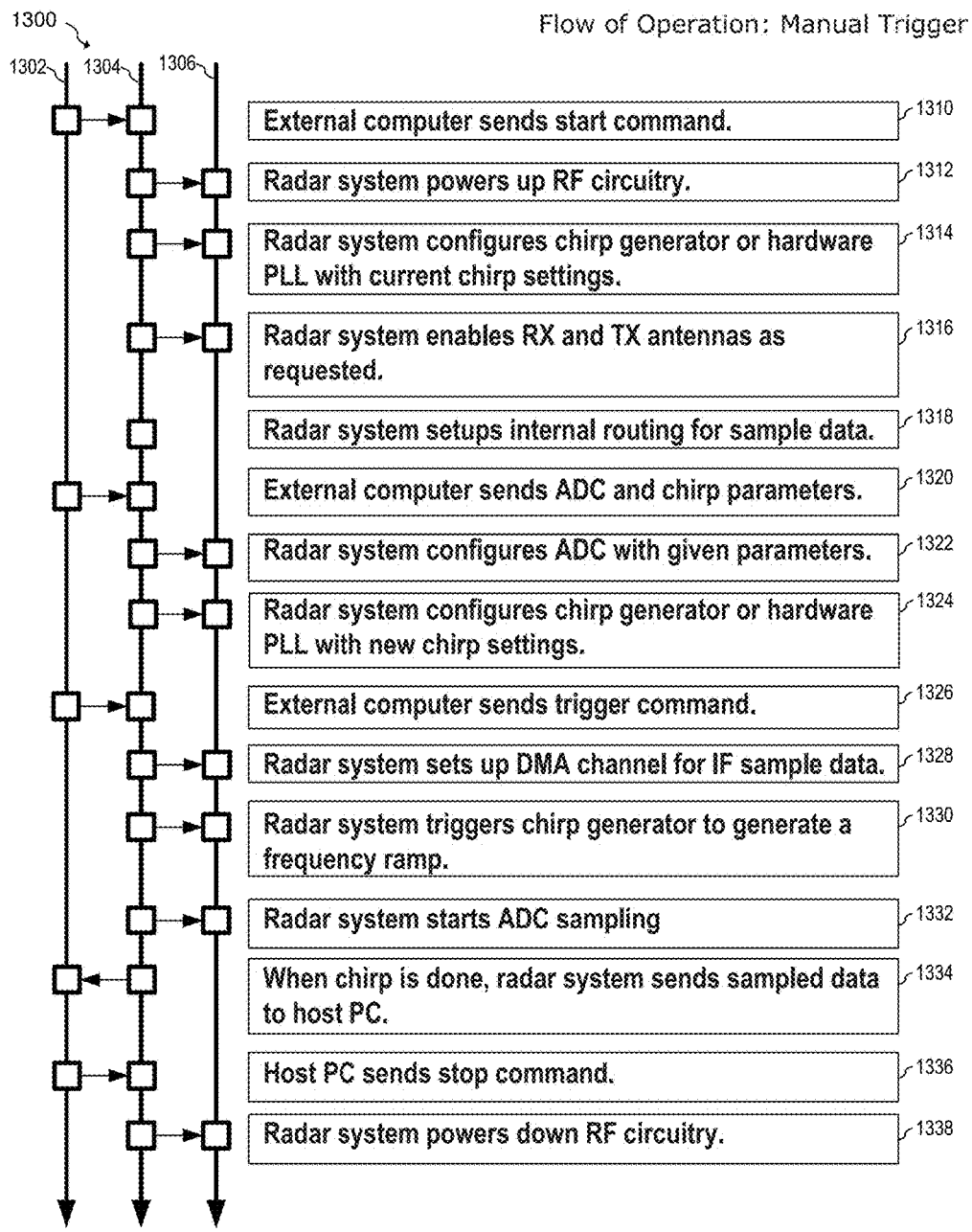
FIG. 13 illustrates a flow chart of an embodiment manual trigger mode of operation.

FIG. 13 illustrates a flow diagram 1300 of an embodiment manual trigger mode of operation. Boxes along lines 1302, 1304 and 1306 indicate the flow of data at each step. A box on line 1302 represents activity performed by communication protocol block 1102, and a box on line 1304 represents activity performed by control blocks such as radar system 1104, frame sequencer 1108, antenna controller 1112 and chirp generator 1110. A box on line 1306 represents activity performed by various low-level drivers.

In an embodiment, a start command is received from an external computer in step 1310. Upon receipt of this start command, the radar system 1104 powers up RF circuitry within the radar system (step 1312), configures chirp generator 1110 or a hardware PLL with the current chirp settings (step 1314) and enables the receive and transmit antennas within the radar system (step 1316). In step 1318, radar system 1104 sets up internal routing for sampled data.

In step 1320, ADC parameters and chirp parameters are received from the external computer, and in step 1322, radar system 1104 configures the ADC with the received parameters. In step 1324, radar system 1104 configures the chirp generator 1110 or hardware PLL with the newly received chip settings.

When a trigger command is received from the external computer in step 1326, radar system 1104 sets up a DMA channel for IF sample data (step 1328), triggers chirp generator 1110 to generate a frequency ramp in step 1330, and starts ADC sampling (step 1332). When the chirp or frequency ramp is complete, radar system 1104 sends sampled data to external computer in step 1334. Upon receipt of a stop command from the external computer (step 1336), radar system 1104 powers down RF circuitry in the radar system (step 1338).

Figure 14:
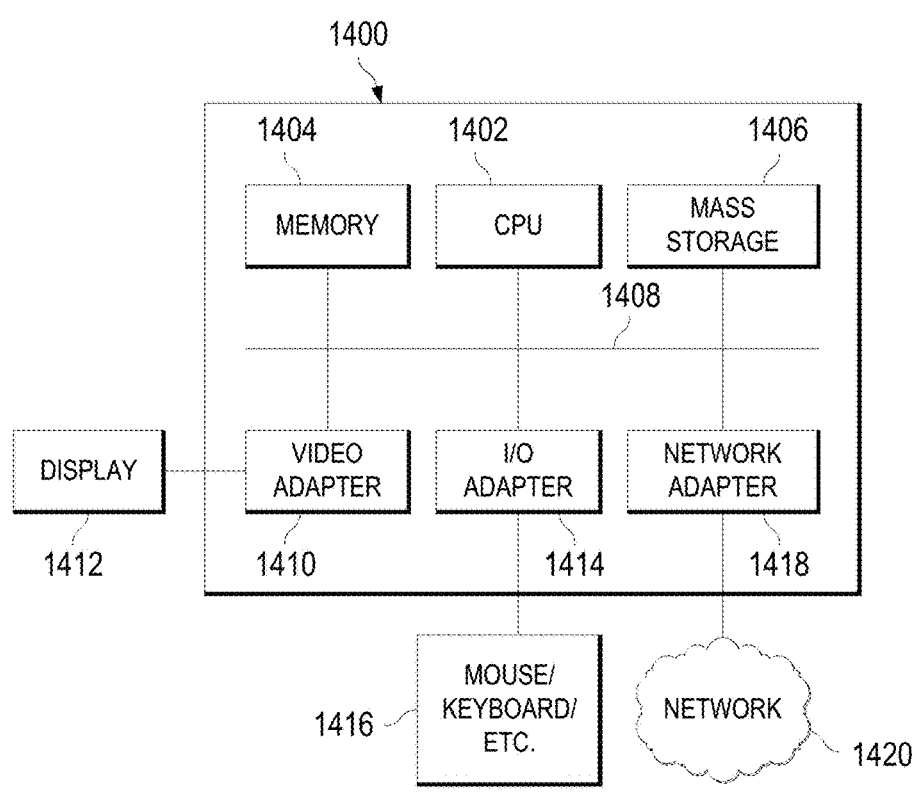
FIG. 14 illustrates a block diagram of an embodiment processing system.

Referring now to FIG. 14, a block diagram of a processing system 1400 is provided in accordance with an embodiment of the present invention. The processing system 1400 depicts a general-purpose platform and the general components and functionality that may be used to implement portions of the embodiment radar system and/or an external computer or processing device interfaced to the embodiment radar system. The processing system 1400 may include, for example, a central processing unit (CPU) 1402, memory 1404, and a mass storage device 1406 connected to a bus 1408 configured to perform the processes discussed above. The processing system 1400 may further include, if desired or needed, a video adapter 1410 to provide connectivity to a local display 1412 and an input-output (I/O) Adapter 1414 to provide an input/output interface for one or more input/output devices 1416, such as a mouse, a keyboard, printer, tape drive, CD drive, or the like.

The processing system 1400 also includes a network interface 1418, which may be implemented using a network adaptor configured to be coupled to a wired link, such as an Ethernet cable, USB interface, or the like, and/or a wireless/cellular link for communications with a network 1420. The network interface 1418 may also comprise a suitable receiver and transmitter for wireless communications. It should be noted that the processing system 1400 may include other components. For example, the processing system 1400 may include power supplies, cables, a motherboard, removable storage media, cases, and the like. These other components, although not shown, are considered part of the processing system 1400.

Embodiments of the present invention are summarized here. Other embodiments can also be understood form the entirety of the specification and the claims filed herein. One general aspect includes a packaged radio frequency (RF) circuit having a radio frequency integrated circuit (RFIC) disposed on a package substrate, a receive antenna system disposed on the package substrate adjacent to a first edge of the RFIC, a first transmit antenna disposed on the package substrate adjacent to a second edge of the RFIC and electrically coupled to the first transmit port of the RFIC, a first plurality of solder balls disposed on the package substrate adjacent to the RFIC and electrically connected to the RFIC; a second plurality of solder balls disposed on the package substrate adjacent to the receive antenna system that are electrically floating, and a ground wall disposed on the package substrate between the RFIC and the receive antenna system. The RFIC includes a plurality of receiver circuits coupled to receive ports at the first edge of the RFIC and a first transmit circuit coupled to a first transmit port at the second edge of the RFIC different from the first edge, and the receive antenna system includes a plurality of receive antenna elements that are each electrically coupled to a corresponding receive port.

Implementations may include one or more of the following features. The packaged RF circuit where: the RFIC further includes a second transmit circuit coupled to a second transmit port at a third edge of the RFIC different from the first edge and different from the second edge; and the RF circuit further includes a second transmit antenna disposed on the package substrate adjacent to the third edge of the RFIC and electrically coupled to the second transmit port of the RFIC. In some embodiments, the second transmit circuit includes an input selectable between an unmodulated carrier and modulated carrier. The RFIC may further include a bipolar phase shift key (BPSK) modulator coupled to the second transmit circuit.

In an embodiment, the second edge and the third edge are each adjacent to the first edge. Each of plurality of receive antenna elements may include a patch antenna; and the first transmit antenna may include a patch antenna. In some embodiments, the receive antenna system includes exactly four receive antenna elements. The ground wall may include a plurality of grounded solder balls disposed between the receive antenna system and the RFIC. In some implementations, the packaged RF circuit is a ball grid array (BGA) package.

Another general aspect includes a system including: a packaged radio frequency (RF) circuit having a radio frequency integrated circuit (RFIC) disposed on a package substrate and a circuit board coupled to the packaged radio frequency (RF) circuit via a first plurality of solder balls, a second plurality of solder balls and grounded solder balls. The RFIC includes a plurality of receiver circuits coupled to receive ports at a first edge of the RFIC, and a first transmit circuit coupled to a first transmit port at a second edge of the RFIC different from the first edge. The RFIC further includes a receive patch antenna system disposed on the package substrate adjacent to the first edge of the RFIC that includes a plurality of receive patch antenna elements that are each electrically coupled to a corresponding receive port, a first transmit patch antenna disposed on the package substrate adjacent to the second edge of the RFIC and electrically coupled to the first transmit port of the RFIC, a second transmit patch antenna disposed on the package substrate adjacent to the third edge of the RFIC and electrically coupled to the second transmit port of the RFIC, a first plurality of solder balls disposed on the package substrate adjacent to the RFIC and electrically connected to the RFIC, a second plurality of solder balls disposed on the package substrate adjacent to the receive patch antenna system, where the second plurality of solder balls are electrically floating, and a ground wall disposed on the package substrate between the RFIC and the receive patch antenna system, where the ground wall including grounded solder balls. The packaged radio frequency (RF) circuit also includes a circuit board coupled to the packaged radio frequency (RF) circuit via the first plurality of solder balls, the second plurality of solder balls and the grounded solder balls.

Implementations may include one or more of the following features. The system where the circuit board includes a FR4 layer and a ground plane, where the ground plane is disposed on an opposite side of the circuit board from the packaged radio frequency (RF) circuit. In some embodiments, the receive patch antenna system includes exactly four receive patch antenna elements. In some embodiments the packaged RF circuit includes circuit includes a ball grid array (BGA) package.

A further general aspect includes a system including: a circuit board; a radio frequency integrated circuit (RFIC) disposed on the circuit board, the RFIC including a plurality of receiver circuits coupled to receive ports at a first edge of the RFIC, and a first transmit circuit coupled to a first transmit port at a second edge of the RFIC different from the first edge, and a second transmit circuit coupled to a second transmit port at a third edge of the RFIC, wherein the first edge, the second edge and the third edge are different from each other; a receive patch antenna system disposed on the circuit board adjacent to the first edge of the RFIC, the receive patch antenna system including a plurality of receive patch antenna elements that are each electrically coupled to a corresponding receive port; a first transmit patch antenna disposed on the circuit board adjacent to the second edge of the RFIC and electrically coupled to the first transmit port of the RFIC; a second transmit patch antenna disposed on the circuit board adjacent to the second edge of the RFIC and electrically coupled to the second transmit port of the RFIC; a first plurality of solder balls disposed on the circuit board adjacent to the RFIC and electrically connected to the RFIC;

a second plurality of solder balls disposed on the circuit board adjacent to the receive patch antenna system, where the second plurality of solder balls are electrically floating; and a ground wall disposed on the circuit board between the RFIC and the receive patch antenna system, the ground wall including grounded solder balls.

Implementations may include one or more of the following features. The system where the circuit board includes an FR4 layer and a ground plane, where the ground plane is disposed on an opposite side of the circuit board from the RFIC. The system where the receive patch antenna system includes exactly four receive patch antenna elements. The system where the RFIC includes a frequency modulated continuous wave (FMCW) radar front-end. The system further including a baseband gesture recognition circuit coupled to the RFIC. The system where the baseband gesture recognition circuit includes: a plurality of analog-to-digital converters (ADCs) coupled to intermediate frequency receive outputs of the RFIC; and an intermediate frequency processor coupled to the plurality of ADCs. In some embodiments, the second transmit antenna is a patch antenna or a Yagi-Uda antenna.

Another general aspect includes a radar system including: a plurality of receive antennas; a plurality of transmit antennas; a radar front-end circuit including a plurality of receive circuits coupled to the plurality of receive antennas and a plurality of transmit circuits coupled to the plurality of transmit antennas; an oscillator having an output coupled to the plurality of transmit circuits; and a radar processing circuit coupled outputs of the plurality of receive circuits and a control input of the oscillator.

Implementations may include one or more of the following features. The radar system where the radar processing circuit includes a phase locked loop coupled to the control input of the oscillator. In some embodiments, the phase locked loop includes an analog phased-locked loop coupled to the control input of the oscillator and the radar processing circuit. The phase locked loop may include software PLL having a digital-to-analog converter and an integrator coupled between an output of the digital-to-analog converter and the control input of the oscillator.

In some embodiments, the radar processing circuit includes a frequency modulated continuous wave (FMCW) generator coupled to the control input of the oscillator. The FMCW generator may configured to produce a modulation bandwidth of between 2 GHz and 8 GHz, a minimum intermediate frequency (IF) of between 6 KHz and 9 KHz, and a maximum IF between 150 KHz and 250 KHz. The radar system may further include a digital signal processor coupled to outputs of the plurality of analog-to-digital converters. In an embodiment, the digital signal processor is configured to perform a weighted FFT on each of the outputs of the plurality of analog-to-digital converters, and sum results of the weighted FFT to form a weighted sum. In a further embodiment, FMCW generator is configured to produce a modulation bandwidth of between 2 GHz and 8 GHz, a minimum intermediate frequency (IF) of between 3 KHz and 5 KHz, and a maximum IF between 800 KHz and 1.2 MHz. A center frequency of the oscillator may be set to be between 50 GHz and 70 GHz. In some embodiments, the radar system further includes a plurality of analog-to-digital converters having inputs coupled to corresponding outputs of the plurality of receive circuits.

In various embodiments the radar system may further include a digital interface coupled to outputs of the plurality of analog-to-digital converters. The digital interface may be implemented, for example, using a USB interface. In an embodiment, the radar processing circuit is configured to activate a first of the plurality of transmit circuits for a first period of time and then activate a second of the plurality of transmit circuits a second period of time after the first period of time. With respect to the manner in which the antennas are implemented, the plurality of receive antennas may include a plurality of Yagi-Uda receive antennas and the plurality of transmit antennas include a Yagi-Uda transmit antenna. In other embodiments, the plurality of receive antennas includes a plurality of patch receive antennas and the plurality of transmit antennas include a plurality of patch transmit antennas. The plurality of patch receive antennas may be arranged adjacent to a first edge of the radar front-end circuit such that a first portion of the plurality of the patch transmit antennas is arranged on a second edge of the radar front-end circuit and second portion of the plurality of the patch transmit antennas is arranged on a third edge of the radar front-end circuit. In some embodiments, the second edge is adjacent to the first edge and the third edge is adjacent to the first edge.

Another general aspect includes a method of operating a radar system that includes: receiving radar configuration data from a host that includes chirp parameters and frame sequence settings. The method further includes receiving a start commend from the host after receiving the radar configuration data; and after receiving the start command, configuring a frequency generation circuit with the chirp parameters, configuring a frame sequencer with the frame sequencer settings, and triggering radar frames at a preselected rate.

Implementations may include one or more of the following features. The method further including: receiving a stop command from the host; and stopping triggering the radar frames upon receipt of the stop command. The method may further include powering down RF circuitry of the radar system upon receipt of the stop command, and may further include powering up RF circuitry of the radar system upon receipt of the start command. In some embodiments, triggering radar frames includes: triggering a frequency generation circuit to generate a frequency ramp based on the chirp parameters; receiving samples from an analog-to-digital converter coupled to a receiver of the radar system; and sending the received samples to the host. Trigger triggering radar frames may further include: enabling receive and transmit antennas of the radar system at beginning of the radar frame; and disabling the receive and transmit antennas of the radar system at end of the radar frame.

A further general aspect includes a method of operating a radar system that includes: receiving radar configuration data from a host that includes chirp parameters. Upon receipt of the radar configuration data, a frequency generation circuit is configured with the chirp parameters; a trigger command is received from the host; and upon receipt of the trigger command, the frequency generation circuit is triggered to perform a frequency ramp based on the chirp parameters, samples are received from the radar system, and the received samples are sent to the host.

Implementations may include one or more of the following features. The method further including: receiving a start command from the host; upon receipt of the start command, powering up RF circuitry of the radar system, and enabling receive and transmit antennas of the radar system; receiving a stop command from the host; and upon receipt of the stop command, powering down the RF circuitry. The method may further include, upon receipt of the start command, configuring internal routing for sampled data. In some embodiments, the method further includes, upon receipt of the trigger command, starting an analog to digital converter coupled to receivers of the radar system to start sampling.

A further aspect includes a radar system having a processor circuit configured to be coupled to radar hardware and a non-transitory computer readable medium coupled to the processor circuit. The non-transitory computer readable medium includes an executable program that instructs the processor circuit to perform the steps of receiving radar configuration data from a host, where the radar configuration data including chirp parameters and frame sequence settings; and receiving a start command from the host after receiving the radar configuration data. After receiving the start command, the executable program instructs the processor circuit to configure a frequency generation circuit with the chirp parameters, configure a frame sequencer with the frame sequencer settings, and trigger radar frames at a preselected rate.

Implementations may include one or more of the following features. The radar system where the executable program instructs the processor circuit to perform the further steps of: receiving a stop command from the host and stopping triggering the radar frames upon receipt of the stop command. The executable program may further instruct the processor circuit to perform the further step of powering down RF circuitry of the radar system upon receipt of the stop command and/or perform the further step of powering up RF circuitry of the radar system upon receipt of the start command. In some embodiments, the executable program instruction step of triggering the radar frames includes the steps of: triggering a frequency generation circuit to generate a frequency ramp based on the chirp parameters; receiving samples from an analog-to-digital converter coupled to a receiver of the radar system; and sending the received samples to the host. In various embodiments, the executable program instruction step of triggering the radar frames further includes the steps of: enabling receive antennas and transmit antennas of the radar system at beginning of the radar frame; and disabling the receive antennas and the transmit antennas of the radar system at end of the radar frame. In some embodiments, the radar system further includes radar hardware that may include RF circuitry and the frequency generation circuit.

Another general aspect includes a radar system having a processor circuit configured to be coupled to radar hardware and a non-transitory computer readable medium coupled to the processor circuit. The non-transitory computer readable medium includes an executable program that instructs the processor circuit to perform the steps of: receiving radar configuration data from a host, where the radar configuration data includes chirp parameters; upon receipt of the radar configuration data, configuring a frequency generation circuit with the chirp parameters; receiving a trigger command from the host; and upon receipt of the trigger command, triggering the frequency generation circuit to perform a frequency ramp based on the chirp parameters, receiving samples from the radar system, and sending the received samples to the host.

Implementations may include one or more of the following features. The radar system where the executable program instructs the processor circuit to perform the further steps of: receiving a start command from the host; upon receipt of the start command, powering up RF circuitry of the radar system, and enabling receive and transmit antennas of the radar system; receiving a stop command from the host; and upon receipt of the stop command, powering down the RF circuitry. The executable program may instruct the processor circuit to perform the further steps of configuring internal routing for sampled data upon receipt of the start command and/or upon receipt of the trigger command, starting an analog to digital converter coupled to receivers of the radar system to start sampling. In some embodiments, the radar system further includes radar hardware. The radar hardware may include, for example, RF circuitry and the frequency generation circuit.

Another general aspect includes a method of operating a radio frequency system including a radio frequency integrated circuit (RFIC) disposed on a circuit board. The method includes receiving a first RF signal using a plurality of receiver circuits of the RFIC that are electrically coupled to a corresponding plurality of receive patch antenna elements that are disposed on the circuit board adjacent to a first edge of the RFIC. The method also includes transmitting a second RF signal using a first transmit circuit of the RFIC that is electrically coupled to a first transmit patch antenna disposed on the circuit board adjacent to a second edge of the RFIC, and using a second transmit circuit of the RFIC that is electrically coupled to a second antenna disposed on the circuit board adjacent to a third edge of the RFIC. The first edge, second edge and third edge are different from each other. The method also includes shielding the first RF signal using a first plurality of solder balls disposed on the circuit board adjacent to the RFIC and electrically connected to the RFIC, a second plurality of electrically floating solder balls disposed on the circuit board adjacent to the plurality of receive patch antenna elements, and a ground wall including grounded solder balls disposed on the circuit board between the RFIC and the plurality of receive patch antenna elements.

Implementations may include one or more of the following features. The method where the second antenna includes a patch antenna a Yagi-Uda antenna. The method may further include downconverting the received first RF signal to an intermediate frequency to form an intermediate frequency signal. In some embodiments, the method may further include performing an analog-to-digital conversion of the intermediate frequency signal.

Advantages of embodiments of the present invention include the ability to implement a high frequency radar system in a small, cost effective package. Embodiments that utilize dummy solder balls are advantageous in that they are mechanically stable and that the solder balls themselves maintain their integrity over many temperature cycles. In some embodiments, each solder ball may be configured to withstand greater than 500 temperature cycles.

A further advantage includes the ability to provide an accurate gesture recognition system in a small form factor. Further advantages of some embodiments include the ability for a designer to design a high frequency RF system without worrying about high frequency transition design. Accordingly, system designers for embodiment RF radar systems may focus on the development of algorithms for processing the raw data produced by the embodiment RF hardware.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A packaged radio frequency (RF) circuit comprising:
   a radio frequency integrated circuit (RFIC) disposed on a package substrate, the RFIC comprising a plurality of receiver circuits coupled to receive ports at a first edge of the RFIC, and a first transmit circuit coupled to a first transmit port at a second edge of the RFIC different from the first edge;
a receive antenna system disposed on the package substrate adjacent to the first edge of the RFIC, the receive antenna system comprising a plurality of receive antenna elements that are each electrically coupled to a corresponding receive port;
a first transmit antenna disposed on the package substrate adjacent to the second edge of the RFIC and electrically coupled to the first transmit port of the RFIC;
a first plurality of solder balls disposed on the package substrate adjacent to the RFIC and electrically connected to the RFIC;
a second plurality of solder balls disposed on the package substrate adjacent to the receive antenna system, wherein the second plurality of solder balls are electrically floating; and
a ground wall disposed on the package substrate between the RFIC and the receive antenna system.

2. The packaged RF circuit of claim 1, wherein:
the RFIC further comprises a second transmit circuit coupled to a second transmit port at a third edge of the RFIC different from the first edge and different from the second edge; and
the RF circuit further comprises a second transmit antenna disposed on the package substrate adjacent to the third edge of the RFIC and electrically coupled to the second transmit port of the RFIC.

3. The packaged RF circuit of claim 2, wherein the second transmit circuit comprises an input selectable between an unmodulated carrier and a modulated carrier.

4. The packaged RF circuit of claim 3, wherein the RFIC further comprises a bipolar phase shift key (BPSK) modulator coupled to the second transmit circuit.

5. The packaged RF circuit of claim 2, wherein the second edge and the third edge are each adjacent to the first edge.

6. The packaged RF circuit of claim 1, wherein:
each of plurality of receive antenna elements comprises a patch antenna; and
the first transmit antenna comprises a patch antenna.

7. The packaged RF circuit of claim 1, wherein the receive antenna system includes exactly four receive antenna elements.

8. The packaged RF circuit of claim 1, wherein the ground wall comprises a plurality of grounded solder balls disposed between the receive antenna system and the RFIC.

9. The packaged RF circuit of claim 1, wherein the packaged RF circuit is a ball grid array (BGA) package.

10. A system comprising:
a packaged radio frequency (RF) circuit comprising
a radio frequency integrated circuit (RFIC) disposed on a package substrate, the RFIC comprising a plurality of receiver circuits coupled to receive ports at a first edge of the RFIC, a first transmit circuit coupled to a first transmit port at a second edge of the RFIC, and a second transmit circuit coupled to a second transmit port at a third edge of the RFIC, wherein the first edge, the second edge and the third edge are different from each other,
a receive patch antenna system disposed on the package substrate adjacent to the first edge of the RFIC, the receive patch antenna system comprising a plurality of receive patch antenna elements that are each electrically coupled to a corresponding receive port,
a first transmit patch antenna disposed on the package substrate adjacent to the second edge of the RFIC and electrically coupled to the first transmit port of the RFIC,
a second transmit patch antenna disposed on the package substrate adjacent to the third edge of the RFIC and electrically coupled to the second transmit port of the RFIC,
a first plurality of solder balls disposed on the package substrate adjacent to the RFIC and electrically connected to the RFIC,
a second plurality of solder balls disposed on the package substrate adjacent to the receive patch antenna system, wherein the second plurality of solder balls are electrically floating, and
a ground wall disposed on the package substrate between the RFIC and the receive patch antenna system, the ground wall comprising grounded solder balls; and
a circuit board coupled to the packaged radio frequency (RF) circuit via the first plurality of solder balls, the second plurality of solder balls and the grounded solder balls.

11. The system of claim 10, wherein the circuit board comprises a FR4 layer and a ground plane, wherein the ground plane is disposed on an opposite side of the circuit board from the packaged radio frequency (RF) circuit.

12. The system of claim 10, wherein the receive patch antenna system includes exactly four receive patch antenna elements.

13. The system of claim 10, wherein the packaged radio frequency (RF) circuit comprises a ball grid array (BGA) package.

14. A system comprising:
a circuit board;
a radio frequency integrated circuit (RFIC) disposed on the circuit board, the RFIC comprising a plurality of receiver circuits coupled to receive ports at a first edge of the RFIC, a first transmit circuit coupled to a first transmit port at a second edge of the RFIC, and a second transmit circuit coupled to a second transmit port at a third edge of the RFIC, wherein the first edge, the second edge and the third edge are different from each other;
a receive patch antenna system disposed on the circuit board adjacent to the first edge of the RFIC, the receive patch antenna system comprising a plurality of receive patch antenna elements that are each electrically coupled to a corresponding receive port;
a first transmit patch antenna disposed on the circuit board adjacent to the second edge of the RFIC and electrically coupled to the first transmit port of the RFIC;
a second transmit antenna disposed on the circuit board adjacent to the third edge of the RFIC and electrically coupled to the second transmit port of the RFIC;
a first plurality of solder balls disposed on the circuit board adjacent to the RFIC and electrically connected to the RFIC;
a second plurality of solder balls disposed on the circuit board adjacent to the receive patch antenna system, wherein the second plurality of solder balls are electrically floating; and
a ground wall disposed on the circuit board between the RFIC and the receive patch antenna system, the ground wall comprising grounded solder balls.

15. The system of claim 14, wherein the circuit board comprises a FR4 layer and a ground plane, wherein the ground plane is disposed on an opposite side of the circuit board from the RFIC.

16. The system of claim 14, wherein the receive patch antenna system includes exactly four receive patch antenna elements.

17. The system of claim 14, wherein the RFIC comprises a frequency modulated continuous wave (FMCW) radar front-end.

18. The system of claim 17, further comprising a baseband gesture recognition circuit coupled to the RFIC.

19. The system of claim 18, wherein the baseband gesture recognition circuit comprises:
a plurality of analog-to-digital converters (ADCs) coupled to intermediate frequency receive outputs of the RFIC; and
an intermediate frequency processor coupled to the plurality of ADCs.

20. The system of claim 14, wherein the second transmit antenna comprises a patch antenna.

21. The system of claim 14, wherein the second transmit antenna comprises a Yagi-Uda antenna.

22. A method of operating a radio frequency system comprising a radio frequency integrated circuit (RFIC) disposed on a circuit board, the method comprising:
receiving a first RF signal using a plurality of receiver circuits of the RFIC that are electrically coupled to a corresponding plurality of receive patch antenna elements that are disposed on the circuit board adjacent to a first edge of the RFIC;
transmitting a second RF signal using a first transmit circuit of the RFIC that is electrically coupled to a first transmit patch antenna disposed on the circuit board adjacent to a second edge of the RFIC, and using a second transmit circuit of the RFIC that is electrically coupled to a second antenna disposed on the circuit board adjacent to a third edge of the RFIC, wherein the first edge, second edge and third edge are different from each other; and
shielding the first RF signal using a first plurality of solder balls disposed on the circuit board adjacent to the RFIC and electrically connected to the RFIC, a second plurality of electrically floating solder balls disposed on the circuit board adjacent to the plurality of receive patch antenna elements, and a ground wall comprising grounded solder balls disposed on the circuit board between the RFIC and the plurality of receive patch antenna elements.

23. The method of claim 22, wherein the second antenna comprises a patch antenna.

24. The method of claim 22, wherein the second antenna comprises a Yagi-Uda antenna.

25. The method of claim 22, further comprising down-converting the received first RF signal to an intermediate frequency to form an intermediate frequency signal.

26. The method claim 25, further comprising performing an analog-to-digital conversion of the intermediate frequency signal.

* * * * *